(12) United States Patent
Yu et al.

(10) Patent No.: US 9,893,042 B2
(45) Date of Patent: Feb. 13, 2018

(54) SEMICONDUCTOR DEVICE AND METHOD

(71) Applicant: Taiwan Semiconductor Manufacturing Company, Ltd., Hsin-Chu (TW)

(72) Inventors: Chen-Hua Yu, Hsin-Chu (TW); Chih-Yuan Chang, Hsin-Chu (TW); Chuei-Tang Wang, Taichung (TW); Jeng-Shien Hsieh, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/147,617

(22) Filed: May 5, 2016

(65) Prior Publication Data

US 2017/0170155 A1 Jun. 15, 2017

Related U.S. Application Data

(60) Provisional application No. 62/266,945, filed on Dec. 14, 2015.

(51) Int. Cl.
*H01L 23/02* (2006.01)
*H01L 23/22* (2006.01)
(Continued)

(52) U.S. Cl.
CPC ............ *H01L 25/18* (2013.01); *H01L 21/56* (2013.01); *H01L 21/563* (2013.01); *H01L 23/3135* (2013.01); *H01L 23/3142* (2013.01); *H01L 23/3675* (2013.01); *H01L 23/481* (2013.01); *H01L 23/50* (2013.01); *H01L 24/02* (2013.01); *H01L 24/89* (2013.01); *H01L 25/50* (2013.01); *H01L 23/3128* (2013.01); *H01L 2224/0231* (2013.01); *H01L 2224/0239* (2013.01); *H01L 2224/02372* (2013.01); *H01L 2224/80894* (2013.01); *H01L 2924/0105* (2013.01); *H01L 2924/01013* (2013.01);
(Continued)

(58) Field of Classification Search
CPC .............. H01L 25/0657; H01L 25/117; H01L 2924/1427; H01L 2924/1532; H01L 23/31; H01L 23/3114; H01L 23/3107; H01L 23/481; H01L 23/522; H01L 23/5226; H01L 23/538; H01L 2224/16145; H01L 2224/48145; H01L 2224/80001
USPC ........ 257/686, 687, 693, 700; 438/107, 109, 438/127
See application file for complete search history.

(56) References Cited

U.S. PATENT DOCUMENTS 7,808,258 B2   10/2010   Mangrum et al.
8,361,842 B2   1/2013   Yu et al.
(Continued)

FOREIGN PATENT DOCUMENTS

TW   201000924 A   1/2010
TW   201535596 A   9/2015
TW   201541608 A   11/2015

*Primary Examiner* — Hsien Ming Lee
(74) *Attorney, Agent, or Firm* — Slater Matsil, LLP

(57) ABSTRACT

A method and device are provided wherein a first semiconductor device and a via are encapsulated with an encapsulant. A redistribution layer connects the first semiconductor device to a second semiconductor device. In a particular embodiment the first semiconductor device is an integrated voltage regulator and the second semiconductor device is a logic device such as a central processing unit.

25 Claims, 17 Drawing Sheets

(51) Int. Cl.

| | | |
|---|---|---|
| *H01L 23/48* | (2006.01) | |
| *H01L 21/44* | (2006.01) | |
| *H01L 21/50* | (2006.01) | |
| *H01L 25/18* | (2006.01) | |
| *H01L 21/56* | (2006.01) | |
| *H01L 23/31* | (2006.01) | |
| *H01L 23/367* | (2006.01) | |
| *H01L 23/50* | (2006.01) | |
| *H01L 23/00* | (2006.01) | |
| *H01L 25/00* | (2006.01) | |

(52) U.S. Cl.
 CPC ............... *H01L 2924/01029* (2013.01); *H01L 2924/0132* (2013.01); *H01L 2924/01074* (2013.01); *H01L 2924/01079* (2013.01); *H01L 2924/06* (2013.01); *H01L 2924/07025* (2013.01); *H01L 2924/1205* (2013.01); *H01L 2924/1206* (2013.01); *H01L 2924/1207* (2013.01); *H01L 2924/1427* (2013.01); *H01L 2924/1431* (2013.01); *H01L 2924/1432* (2013.01); *H01L 2924/1434* (2013.01); *H01L 2924/1436* (2013.01); *H01L 2924/15321* (2013.01)

(56) References Cited

U.S. PATENT DOCUMENTS

| | | | |
|---|---|---|---|
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 2011/0291288 | A1 | 12/2011 | Wu et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0307140 | A1 | 11/2013 | Huang et al. |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2015/0206866 | A1 | 7/2015 | Yu et al. |
| 2016/0358889 | A1* | 12/2016 | Lai .................. H01L 25/0657 |
| 2017/0012029 | A1 | 1/2017 | Lambert et al. |

* cited by examiner

SEMICONDUCTOR DEVICE AND METHOD

This application claims the benefit of U.S. Provisional Application No. 62/266,945, filed on Dec. 14, 2015, which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing various insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line.

Once singulated, the individual dies may then be packaged with other devices that work complementarily with each other. Such packaging is useful when it might be undesirable to place all of the desired functionality onto a single die. For example, if one functionality might interfere with another functionality, it might be desirable to interconnect disparate dies wherein each die performs the desired functionality without overdue interfere from the other die. However, such interconnection of different functionalities on separate die leads to other problems that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
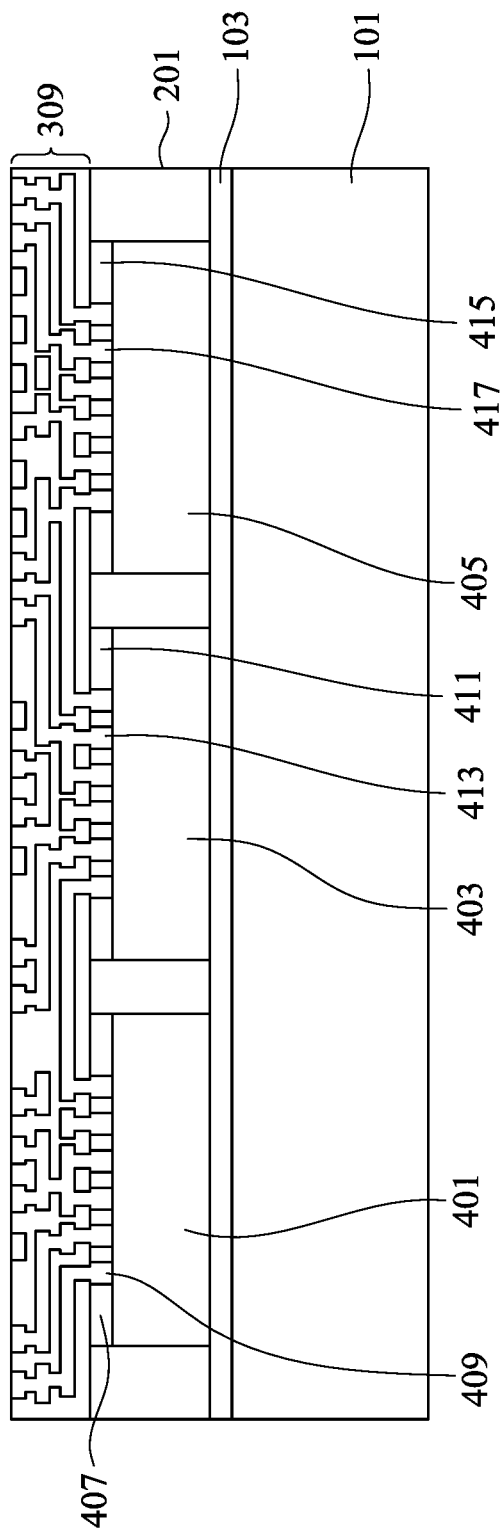
FIGS. 1-4 illustrate integrated semiconductor devices with multiple redistribution layers in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is shown a first carrier substrate 101 with an adhesive layer 103. The first carrier substrate 101 comprises, for example, silicon based materials, such as glass or silicon oxide, or other materials, such as aluminum oxide, combinations of any of these materials, or the like. The first carrier substrate 101 is planar in order to accommodate an attachment of semiconductor devices such as a first semiconductor device 401, a second semiconductor device 403, and a third semiconductor device 405.

The adhesive layer 103 is placed on the first carrier substrate 101 in order to assist in the adherence of overlying structures. In an embodiment the adhesive layer 103 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 103 may be placed onto the first carrier substrate 101 in a semi-liquid or gel form, which is readily deformable under pressure.

Once the adhesive layer 103 has been formed, a first semiconductor device 401, a second semiconductor device 403, and a third semiconductor device 405 may be placed on the adhesive layer 103. In an embodiment the first semiconductor device 401 may be, e.g., a logic die such as a central processing unit (CPU) designed to work in conjunction with a fourth semiconductor device 107 (not illustrated in FIG. 1 but illustrated and described further below with respect to FIGS. 2A-2B), a fifth semiconductor device 109 (also not illustrated in FIG. 1 but illustrated and described below with respect to FIGS. 2A-2B), the second semiconductor device 403, and the third semiconductor device 405. However, the first semiconductor device 401 may be any suitable semiconductor device, such as a graphics processing unit, memory, a high speed I/O, or the like.

In an embodiment the first semiconductor device 401 may comprise a first substrate (not individually illustrated), first active devices (not individually illustrated), first metallization layers, a first redistribution layer, a first passivation layer 407, and first vias 409. The first substrate may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional requirements of the design for the first semiconductor device 401 (e.g., GPU). The first active devices may be formed using any suitable methods either within or else on the first substrate.

The first metallization layers are formed over the first substrate and the first active devices and are designed to connect the various active devices to form functional circuitry. In an embodiment the first metallization layers are formed of alternating layers of dielectric and conductive material and may be formed through any suitable process (such as deposition, damascene, dual damascene, etc.). In an embodiment there may be four layers of metallization separated from the first substrate by at least one interlayer dielectric layer (ILD), but the precise number of first metallization layers is dependent upon the design of the first semiconductor device 401.

The first redistribution layer may be formed over and in electrical contact with the first metallization layers. The first redistribution layer may comprise aluminum, but other materials, such as copper, may alternatively be used. The first redistribution layer may be formed using a deposition process, such as sputtering, to form a layer of material (not shown) and portions of the layer of material may then be removed through a suitable process (such as photolithographic masking and etching) to form the first redistribution layer. However, any other suitable process may be utilized to form the first redistribution layer.

The first passivation layer 407 may be formed on the first substrate over the first metallization layers and the first redistribution layer. The first passivation layer 407 may be made of one or more suitable dielectric materials such as polyimide, silicon oxide, silicon nitride, low-k dielectrics such as carbon doped oxides, extremely low-k dielectrics such as porous carbon doped silicon dioxide, combinations of these, or the like. The first passivation layer may be formed through a process such as chemical vapor deposition (CVD), although any suitable process may be utilized, and may have a thickness between about 0.5 µm and about 5 µm, such as about 9.25 KÅ.

Once the first passivation layer 407 has been formed, the first via 409 may be formed through the first passivation layer 407 to be in contact with the first redistribution layer. In an embodiment the first via 409 may be formed by initially patterning an opening through the first passivation layer 407 using, e.g., a photolithographic masking and etching process. Once an opening has been formed, the opening may be filled or overfilled with a material such as copper, aluminum or tungsten using a process such as electroplating, sputtering, or the like. Once deposited, any conductive material remaining outside of the opening may be removed using, e.g., a planarization process such as chemical mechanical polishing.

The second semiconductor device 403 may be, e.g., another central processing unit designed to work in conjunction with the fourth semiconductor device 107, the fifth semiconductor device 109, the first semiconductor device 401 (e.g., the CPU), and the third semiconductor device 405. However, the second semiconductor device 403 may be any suitable semiconductor device, such as a GPU, a memory, a high speed I/O, or the like.

In an embodiment the second semiconductor device 403 may comprise a second substrate, second active devices (not individually illustrated), second metallization layers (not individually illustrated), second redistribution layers (not individually illustrated), a second passivation layer 411, and second vias 413. In an embodiment the second substrate, the second active devices, the second metallization layers, the second redistribution layer, the second passivation layer 411, and the second vias 413 may be similar to the first substrate, the first active devices, the first metallization layers, the first redistribution layer, the first passivation layer 407, and the first vias 409, although they may also be different.

The third semiconductor device 405 may be, e.g., an input/output device designed to work in conjunction with the fourth semiconductor device 107, the fifth semiconductor device 109, the first semiconductor device 401 (e.g., the CPU), and the second semiconductor device 403 (e.g., the CPU). However, the third semiconductor device 405 may be any suitable semiconductor device, such as a CPU, a GPU, a memory, or the like.

In an embodiment the third semiconductor device 405 may comprise a third substrate, third active devices (not individually illustrated), third metallization layers (not individually illustrated), third redistribution layers (not individually illustrated), a third passivation layer 415, and third vias 417. In an embodiment the third substrate, the third active devices, the third metallization layers, the third redistribution layers, the third passivation layer 415, and the third vias 417 may be similar to the first substrate, the first active devices, the first metallization layers, the first redistribution layers, the first passivation layer 407, and the first vias 409, although they may also be different.

In an embodiment the first semiconductor device 401, the second semiconductor device 403, and the third semiconductor device 405 may be placed onto the adhesive layer 103 using, e.g., a pick and place process. However, any other method of placing the first semiconductor device 401, the second semiconductor device 403, and the third semiconductor device 405 may also be utilized.

Once the first semiconductor device 401, the second semiconductor device 403, and the third semiconductor device 405 have been placed, the first semiconductor device 401, the second semiconductor device 403, and the third semiconductor device 405 may be encapsulated with a first encapsulant 201. The encapsulation may be performed in a molding device (not individually illustrated in FIG. 1), which may comprise a top molding portion and a bottom molding portion separable from the top molding portion. When the top molding portion is lowered to be adjacent to the bottom molding portion, a molding cavity may be formed for the first carrier substrate 101, the first semiconductor device 401, the second semiconductor device 403, and the third semiconductor device 405.

During the encapsulation process the top molding portion may be placed adjacent to the bottom molding portion, thereby enclosing the first carrier substrate 101, the first semiconductor device 401, the second semiconductor device 403, and the third semiconductor device 405 within the molding cavity. Once enclosed, the top molding portion and the bottom molding portion may form an airtight seal in order to control the influx and outflux of gasses from the molding cavity. Once sealed, the first encapsulant 201 may be placed within the molding cavity. The first encapsulant 201 may be a molding compound resin such as polyimide, PPS, PEEK, PES, a heat resistant crystal resin, combinations of these, or the like. The first encapsulant 201 may be placed within the molding cavity prior to the alignment of the top molding portion and the bottom molding portion, or else may be injected into the molding cavity through an injection port.

Once the first encapsulant 201 has been placed into the molding cavity such that the first encapsulant 201 encapsulates the first carrier substrate 101, the first semiconductor device 401, the second semiconductor device 403, and the third semiconductor device 405, the first encapsulant 201 may be cured in order to harden the first encapsulant 201 for optimum protection. While the exact curing process is dependent at least in part on the particular material chosen for the first encapsulant 201, in an embodiment in which molding compound is chosen as the first encapsulant 201, the curing could occur through a process such as heating the first encapsulant 201 to between about 100° C. and about 130° C., such as about 125° C. for about 60 sec to about 3000 sec, such as about 600 sec. Additionally, initiators and/or catalysts may be included within the first encapsulant 201 to better control the curing process.

However, as one having ordinary skill in the art will recognize, the curing process described above is merely an exemplary process and is not meant to limit the current embodiments. Other curing processes, such as irradiation or even allowing the first encapsulant 201 to harden at ambient temperature, may alternatively be used. Any suitable curing process may be used, and all such processes are fully intended to be included within the scope of the embodiments discussed herein.

FIG. 1 also illustrates a thinning of the first encapsulant 201 in order to expose the first vias 409 (on the first semiconductor device 401), the second vias 413 (on the second semiconductor device 403), and the third vias 417 (on the third semiconductor device 405) for further processing. The thinning may be performed, e.g., using a mechanical grinding or chemical mechanical polishing (CMP) process whereby chemical etchants and abrasives are utilized to react and grind away the first encapsulant 201 until the first vias 409, the second vias 413, and the third vias 417 have been exposed. As such, the first semiconductor device 401, the second semiconductor device 403, and the third semiconductor device 405 may have a planar surface that is also planar with the first encapsulant 201.

However, while the CMP process described above is presented as one illustrative embodiment, it is not intended to be limiting to the embodiments. Any other suitable removal process may alternatively be used to thin the first encapsulant 201, and expose the first vias 409, the second vias 413, and the third vias 417. For example, a series of chemical etches may be utilized. This process and any other suitable process may alternatively be utilized to thin the first encapsulant 201, and all such processes are fully intended to be included within the scope of the embodiments.

FIG. 1 additionally illustrates a formation of a first redistribution layer 309 in electrical connection with the first vias 409, the second vias 413, and the third vias 417. In an embodiment the first redistribution layer 309 may be formed by initially forming an RDL passivation layer (not separately labeled in FIG. 1). In an embodiment the RDL passivation layer may be polybenzoxazole (PBO), although any suitable material, such as polyimide or a polyimide derivative, may alternatively be utilized. The RDL passivation layer may be placed using, e.g., a spin-coating process to a thickness of between about 5 μm and about 25 μm, such as about 7 μm, although any suitable method and thickness may be used.

Once the RDL passivation layer has been placed, the RDL passivation layer may be patterned in order to allow for electrical connection between, e.g., the first vias 409, the second vias 413, and the third vias 417 and a subsequently formed conductive material. In an embodiment the RDL passivation layer may be patterned using a photolithographic masking and etching process, whereby a photoresist is placed, exposed to an energy source, developed, and then used as a mask during an etching process. However, any suitable method may be used to form and pattern the RDL passivation layer.

Once the RDL passivation layer has been patterned, a first seed layer (not shown) of a titanium copper alloy is formed through a suitable formation process such as CVD or sputtering. A photoresist (also not shown) may then be formed to cover the first seed layer, and the photoresist may then be patterned to expose those portions of the first seed layer that are located where the first redistribution layer 309 is desired to be located.

Once the photoresist has been formed and patterned, a conductive material, such as copper, may be formed on the first seed layer through a deposition process such as plating. The conductive material may be formed to have a thickness of between about 1 μm and about 10 μm, such as about 5 μm. However, while the material and methods discussed are suitable to form the conductive material, these materials are merely exemplary. Any other suitable materials, such as AlCu or Au, and any other suitable processes of formation, such as CVD or PVD, may alternatively be used to form the first redistribution layer 309.

Once the conductive material has been formed, the photoresist may be removed through a suitable removal process such as ashing. Additionally, after the removal of the photoresist, those portions of the first seed layer that were covered by the photoresist may be removed through, for example, a suitable etch process using the conductive material as a mask.

After the conductive material has been formed, the formation of the RDL passivation layer and the conductive material may be repeated in order to form a second layer of conductive material. Such a repetition of processes may be repeated to form a second level of dielectric and conductive materials. Additionally, while only three layers are illustrated in FIG. 1, the process may be repeated any number of times to provide the desired interconnectivity.

Figure 2A:
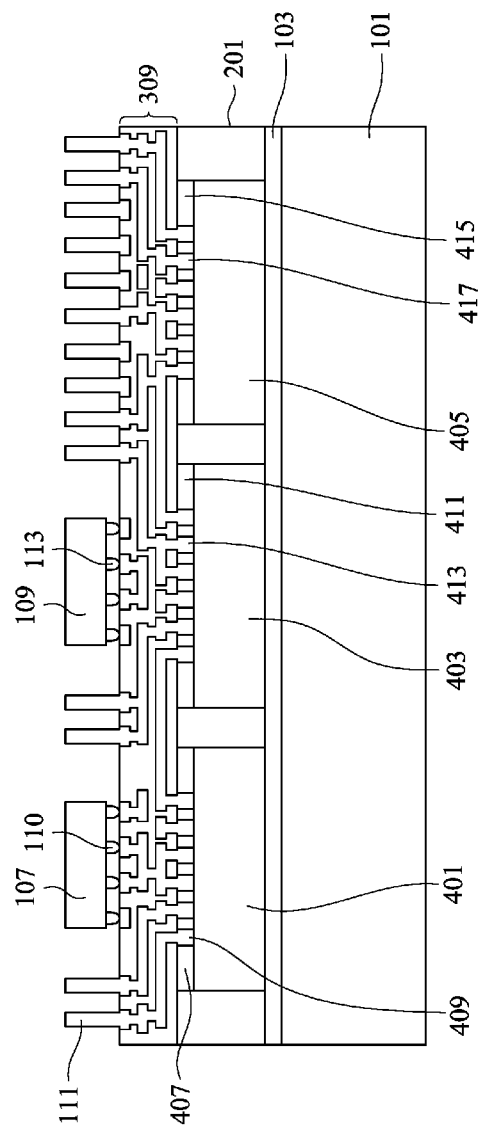
Figure 2B:
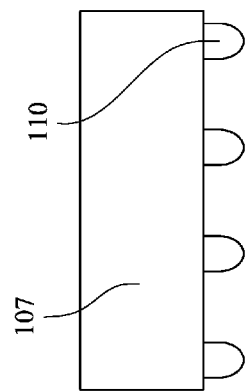

FIGS. 2A-2B illustrate a formation of vias 111 along with a placement of the fourth semiconductor device 107 and the fifth semiconductor device 109. In an embodiment the vias 111 may be formed by initially forming a second seed layer (not separately illustrated in FIG. 1A) over the first redistribution layer 309. In an embodiment the second seed layer for the vias 111 is a thin layer of a conductive material that aids in the formation of a thicker layer during subsequent processing steps. The second seed layer may comprise a layer of titanium about 1,000 Å thick followed by a layer of copper about 5,000 Å thick. The second seed layer may be created using processes such as sputtering, evaporation, or PECVD processes, depending upon the desired materials. The second seed layer may be formed to have a thickness of between about 0.3 µm and about 1 µm, such as about 0.5 µm.

Once the second seed layer has been formed, a photoresist (not illustrated in FIG. 2A) is placed and patterned over the second seed layer. In an embodiment the photoresist may be placed on the second seed layer using, e.g., a spin coating technique to a height of between about 50 µm and about 250 µm, such as about 120 µm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern.

In an embodiment the pattern formed into the photoresist is a pattern for the vias 111 (which may also be known as through InFO vias, or TIVs). The vias 111 are formed in such a placement as to be located on different sides of subsequently attached devices such as the fourth semiconductor device 107 and the fifth semiconductor device 109. However, any suitable arrangement for the pattern of vias 111, such as by being located such that the fourth semiconductor device 107 and the fifth semiconductor device 109 are placed on opposing sides of the vias 111, may be utilized.

In an embodiment the vias 111 are formed within the photoresist. In an embodiment the vias 111 comprise one or more conductive materials, such as copper, tungsten, other conductive metals, or the like, and may be formed, for example, by electroplating, electroless plating, or the like. In an embodiment, an electroplating process is used wherein the second seed layer and the photoresist are submerged or immersed in an electroplating solution. The second seed layer surface is electrically connected to the negative side of an external DC power supply such that the second seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the second seed layer, acquires the dissolved atoms, thereby plating the exposed conductive areas of the second seed layer within the opening of the photoresist.

Once the vias 111 have been formed using the photoresist and the second seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may alternatively be utilized. The removal of the photoresist may expose the underlying portions of the second seed layer.

Once exposed a removal of the exposed portions of the second seed layer may be performed. In an embodiment the exposed portions of the second seed layer (e.g., those portions that are not covered by the vias 111) may be removed by, for example, a wet or dry etching process. For example, in a dry etching process reactants may be directed towards the second seed layer using the vias 111 as masks. In another embodiment, etchants may be sprayed or otherwise put into contact with the second seed layer in order to remove the exposed portions of the second seed layer.

FIG. 2B illustrates a close up view of the fourth semiconductor device 107 that will be attached within the vias 111. In an embodiment the fourth semiconductor device 107 may be a voltage regulator that supplies and/or controls the voltage that is being supplied to, e.g., the first semiconductor device 401, the second semiconductor device 403, and the third semiconductor device 405. In an embodiment in which the fourth semiconductor device 107 is a voltage regulator, the fourth semiconductor device 107 may supply a voltage of between about 0.6 V and about 2.5 V, such as about 1.2 V. However, any suitable voltage may be supplied by the fourth semiconductor device 107.

In an embodiment the fourth semiconductor device 107 comprises a fourth substrate (not individually illustrated), fourth active devices (not individually illustrated), fourth metallization layers (not individually illustrated), first contact pads, a fourth passivation layer, and first external connectors 110. In a particular embodiment the fourth substrate, fourth active devices, and fourth metallization layers may be formed from similar materials and using similar processes as discussed above with respect to the first substrate, the first active device and the first metallization layer, although any suitable materials or processes may be utilized.

The first contact pads may be formed over and in electrical contact with the fourth metallization layers. The first contact pads may comprise aluminum, but other materials, such as copper, may alternatively be used. The first contact pads may be formed using a deposition process, such as sputtering, to form a layer of material (not shown) and portions of the layer of material may then be removed through a suitable process (such as photolithographic masking and etching) to form the first contact pads. However, any other suitable process may be utilized to form the contact pads. The first contact pads may be formed to have a thickness of between about 0.5 µm and about 4 µm, such as about 1.45 µm.

The fourth passivation layer may be formed on the fourth substrate over the fourth metallization layers and the first contact pads. The fourth passivation layer may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The fourth passivation layer may be formed through a process such as chemical vapor deposition (CVD), although any suitable process may be utilized, and may have a thickness between about 0.5 µm and about 5 µm, such as about 9.25 KÅ.

The first external connectors 110 may be formed to provide conductive regions for contact between the first contact pads and, e.g., the first redistribution layer 309. In an embodiment the first external connectors 110 may be microbumps which comprise a eutectic material such as solder, although any suitable materials may alternatively be used. In an embodiment in which the first external connectors 110 are microbumps, the first external connectors 110 may be formed using a ball drop method, such as a direct ball drop process. In another embodiment the microbumps may be formed by initially forming a layer of tin through any suitable method such as evaporation, electroplating, printing, solder transfer, and then performing a reflow in order to shape the material into the desired bump shape. Once the first external connectors 110 have been formed, a test may be performed to ensure that the structure is suitable for further processing. In an embodiment in which the first external connectors 110 are microbumps, the first external connectors 110 may have a diameter of between about 20 µm and about 50 µm.

In another embodiment the first external connectors 110 may be conductive pillars and may be formed by initially forming a photoresist (not shown) over the fourth passivation layer to a thickness between about 5 µm to about 20 µm, such as about 10 µm. The photoresist may be patterned to expose portions of the fourth passivation layers through which the conductive pillars will extend. Once patterned, the photoresist may then be used as a mask to remove the desired portions of the fourth passivation layer, thereby exposing those portions of the underlying first contact pads to which the first external connectors 110 will make contact.

The first external connectors 110 may be formed within the openings of both the fourth passivation layer and the photoresist. The first external connectors 110 may be formed from a conductive material such as copper, although other conductive materials such as nickel, gold, or metal alloy, combinations of these, or the like may also be used. Additionally, the first external connectors 110 may be formed using a process such as electroplating, by which an electric current is run through the conductive portions of the first contact pads to which the first external connectors 110 are desired to be formed, and the first contact pads are immersed in a solution. The solution and the electric current deposit, e.g., copper, within the openings in order to fill and/or overfill the openings of the photoresist and the fourth passivation layer, thereby forming the first external connectors 110. Excess conductive material and photoresist outside of the openings of the first passivation layer may then be removed using, for example, an ashing process, a chemical mechanical polish (CMP) process, combinations of these, or the like.

However, as one of ordinary skill in the art will recognize, the above described processes to form the first external connectors 110 are merely descriptions, and are not meant to limit the embodiments to these exact processes. Rather, the described processes are intended to be illustrative, as any suitable process for forming the first external connectors 110 may be utilized. All suitable processes are fully intended to be included within the scope of the present embodiments.

Returning now to FIG. 2A, FIG. 2A illustrates a placement of the fourth semiconductor device 107 onto the first redistribution layer 309 along with a placement of the fifth semiconductor device 109. In an embodiment the fifth semiconductor device 109 may be another voltage regulator and may comprise a fifth substrate, fifth active devices, fifth metallization layers, second contact pads, a fifth passivation layer (not separately illustrated in FIG. 1A), and second external connectors 113. In an embodiment the fifth substrate, the fifth active devices, the fifth metallization layers, the second contact pads, the fifth passivation layer, and the second external connectors 113 may be similar to the fourth substrate, the fourth active devices, the fourth metallization layers, the first contact pads, the fourth passivation layer, and the first external connectors 110, although they may also be different. In an embodiment the fourth semiconductor device 107 and the fifth semiconductor device 109 may be placed using, e.g., a pick and place process. However, any other method of placing the fourth semiconductor device 107 and the fifth semiconductor device 109 may also be utilized.

Once the fourth semiconductor device 107 and the fifth semiconductor device 109 have been placed in electrical contact with the first redistribution layer 309, the fourth semiconductor device 107 and the fifth semiconductor device 109 are bonded to the first redistribution layer 309. In an embodiment in which the first external connectors 110 and the second external connectors 113 are microbumps, the fourth semiconductor device 107 and the fifth semiconductor device 109 may be bonded by a reflow process, whereby the temperature of the microbumps is increased until the microbumps partially liquefy and begin to flow. Once the temperature is subsequently reduced, the microbumps will resolidify, thereby physically and electrically bonding the fourth semiconductor device 107 and the fifth semiconductor device 109 to the first redistribution layer 309.

In another embodiment in which the first external connectors 110 and the second external connectors 113 are suitable, such as by being copper pillars, the fourth semiconductor device 107 and the fifth semiconductor device 109 may be bonded to the first redistribution layer 309 using a fusion bonding process. For example, exposed portions of the dielectric materials within of the first redistribution layer 309 and the fourth passivation layer (of the fourth semiconductor device 107) and the fifth passivation layer (of the fifth semiconductor device 109) may be initially cleaned using, e.g., a wet cleaning procedure such as an SC-1 or SC-2 cleaning procedure to form a hydrophilic surface. Once cleaned, the fourth semiconductor device 107 and the fifth semiconductor device 109 are aligned into their respective desired positions and the hydrophilic surface is placed into physical contact with the first redistribution layer 309 to begin the bonding procedure. Once the fourth semiconductor device 107 and the fifth semiconductor device 109 have been contacted, a thermal anneal may be utilized to strengthen the bonds.

However, the descriptions of the fusion bonding as described above is merely an example of another type of process that may be utilized in order to bond the fourth semiconductor device 107 and the fifth semiconductor device 109 to the first redistribution layer 309, and is not intended to be limiting upon the embodiments. Rather, any suitable bonding process, such as a hybrid bonding process whereby both the dielectric and conductive portions of the fourth semiconductor device 107 and the fifth semiconductor device 109 are bonded to the first redistribution layer 309, may alternatively be utilized to bond the fourth semiconductor device 107 and the fifth semiconductor device 109 to the first redistribution layer 309, and all such processes are fully intended to be included within the embodiments.

Figure 3:
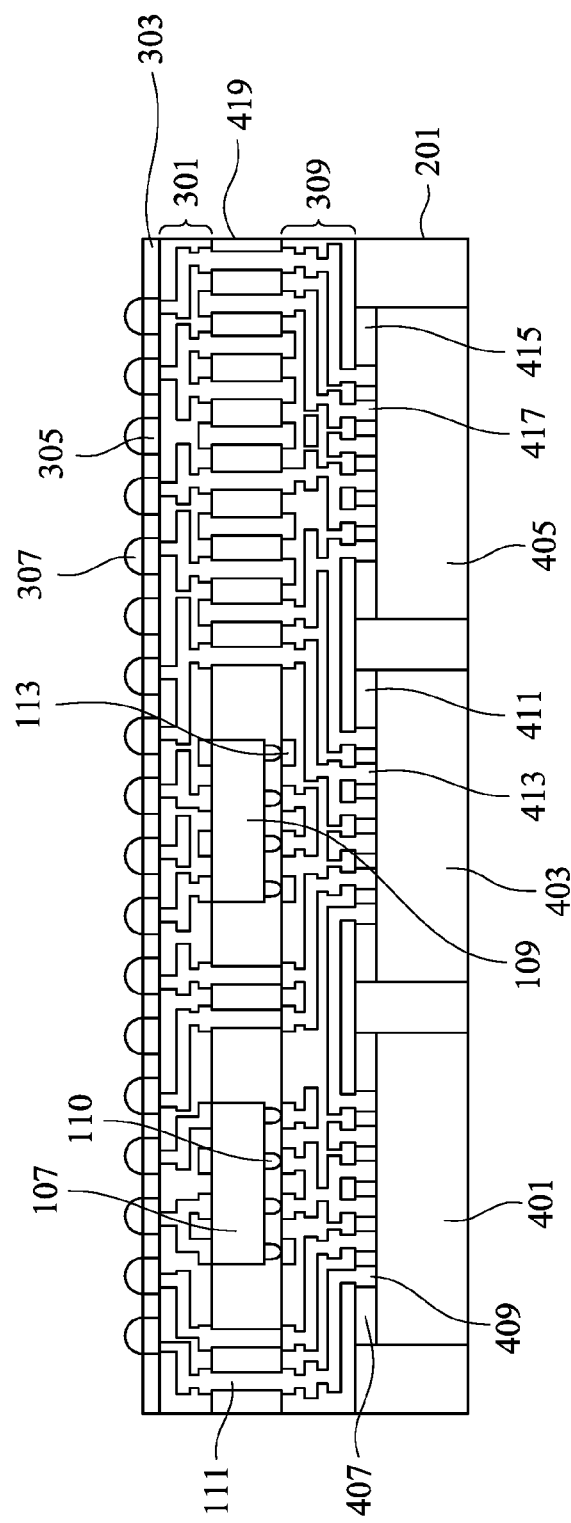

FIG. 3 illustrates an encapsulation of the vias 111, the fourth semiconductor device 107 and the fifth semiconductor device 109. In an embodiment the vias 111, the fourth semiconductor device 107 and the fifth semiconductor device 109 are encapsulated as described above with respect to the encapsulation of the first semiconductor device 401, the second semiconductor device 403, and the third semiconductor device 405. For example, the fourth semiconductor device 107 and the fifth semiconductor device 109 may be placed into a molding chamber (not separately illustrated) and a second encapsulant 419 may be placed over the fourth semiconductor device 107 and the fifth semiconductor device 109. Once in place, if desired, the second encapsulant 419, the vias 111, the fourth semiconductor device 107 and the fifth semiconductor device 109 may be planarized using, e.g., a CMP process until the vias 111, the fourth semiconductor device 107 and the fifth semiconductor device 109 are exposed. However, any suitable process may be used to encapsulate the fourth semiconductor device 107 and the fifth semiconductor device 109.

FIG. 3 illustrates a formation of a second redistribution layer 301 in order to interconnect the fourth semiconductor device 107, the fifth semiconductor device 109, the vias 111 and third external connectors 307. In an embodiment the second redistribution layer 301 may be formed using similar materials and processes as described above with respect to the first redistribution layer 309. However, any suitable process may be utilized to form the second redistribution layer 301.

FIG. 3 also illustrates a formation of first redistribution layer contact pads 305 and a first redistribution layer passivation layer 303 over the second redistribution layer 301 in order to provide protection and isolation for the second redistribution layer 301 and the other underlying structures. In an embodiment the first redistribution layer contact pads 305 may be formed over and in electrical contact with the second redistribution layer 301, and may comprise aluminum, but other materials, such as copper, may alternatively be used. The first redistribution layer contact pads 305 may be formed using a deposition process, such as sputtering, to form a layer of material (not shown) and portions of the layer of material may then be removed through a suitable process (such as photolithographic masking and etching) to form the first redistribution layer contact pads 305. However, any other suitable process may be utilized to form the first redistribution layer contact pads 305. The first redistribution layer contact pads 305 may be formed to have a thickness of between about 0.5 µm and about 4 µm, such as about 1.45 µm.

The first redistribution layer passivation layer 303 is formed over the first redistribution layer contact pads 305 in order to help protect the first redistribution layer contact pads 305 and other underlying structures. In an embodiment the first redistribution layer passivation layer 303 may be polybenzoxazole (PBO), although any suitable material, such as polyimide or a polyimide derivative, may alternatively be utilized. The first redistribution layer passivation layer 303 may be placed using, e.g., a spin-coating process to a thickness of between about 5 µm and about 25 µm, such as about 7 µm, although any suitable method and thickness may alternatively be used.

Once the first redistribution layer contact pads 305 have been formed, third external connectors 307 may be formed in electrical connection with the first redistribution layer contact pads 305. In an embodiment the third external connectors 307 may be controlled collapse chip connection (C4) bumps which comprise a eutectic material such as solder, although any suitable materials may alternatively be used. Optionally, an underbump metallization may be utilized between the third external connectors 307 and the first redistribution layer contact pads 305. In an embodiment in which the third external connectors 307 are C4 bumps, the third external connectors 307 may be formed using a ball drop method, such as a direct ball drop process. Alternatively, the C4 bumps may be formed by initially forming a layer of tin through any suitable method such as evaporation, electroplating, printing, solder transfer, and then performing a reflow in order to shape the material into the desired bump shape. Once the third external connectors 307 have been formed, a test may be performed to ensure that the structure is suitable for further processing. The third external connectors 307 may be formed with a diameter of between about 40 µm and about 120 µm, such as about 80 µm.

FIG. 3 also illustrates a debonding of the first carrier substrate 101. In an embodiment the third external connectors 307 and, hence, the structure including the fourth semiconductor device 107 and the fifth semiconductor device 109, may be attached to a ring structure (not separately illustrated). The ring structure may be a metal ring intended to provide support and stability for the structure during and after the debonding process. In an embodiment the third external connectors 307, the fourth semiconductor device 107, and the fifth semiconductor device 109 are attached to the ring structure using, e.g., a ultraviolet tape, although any other suitable adhesive or attachment may alternatively be used.

Once the third external connectors 307 and, hence, the structure including the fourth semiconductor device 107 and the fifth semiconductor device 109 are attached to the ring structure, the first carrier substrate 101 may be debonded from the structure including the fourth semiconductor device 107 and the fifth semiconductor device 109 using, e.g., a thermal process to alter the adhesive properties of the adhesive layer 103. In a particular embodiment an energy source such as an ultraviolet (UV) laser, a carbon dioxide ($CO_2$) laser, or an infrared (IR) laser, is utilized to irradiate and heat the adhesive layer 103 until the adhesive layer 103 loses at least some of its adhesive properties. Once performed, the first carrier substrate 101 and the adhesive layer 103 may be physically separated and removed from the structure comprising the third external connectors 307, the fourth semiconductor device 107, and the fifth semiconductor device 109.

Figure 4:
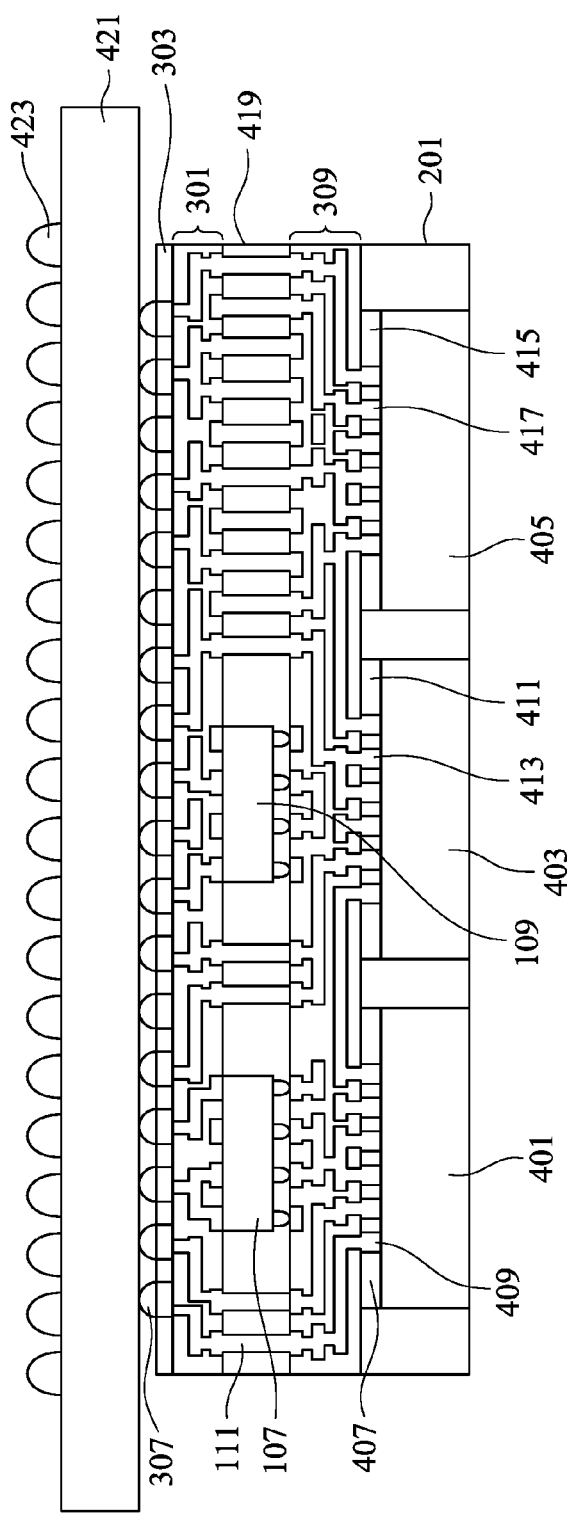

FIG. 4 illustrates a connection of the third external connectors 307 to a substrate 421. In an embodiment the substrate 421 may be a packaging substrate comprising internal interconnects (e.g., through silicon vias and metallization layers) to connect the fourth semiconductor device 107, the fifth semiconductor device 109, the first semiconductor device 401, the second semiconductor device 403, and the third semiconductor device 405 to other external devices (not separately illustrated). In another embodiment, the substrate 421 may be an interposer used as an intermediate substrate to connect the fourth semiconductor device 107, the fifth semiconductor device 109, the first semiconductor device 401, the second semiconductor device 403, and the third semiconductor device 405 to the external devices. In this embodiment the substrate 421 may be, e.g., a silicon substrate, doped or undoped, or an active layer of a silicon-on-insulator (SOI) substrate. However, the substrate 421 may alternatively be a glass substrate, a ceramic substrate, a polymer substrate, or any other substrate that may provide a suitable protection and/or interconnection functionality. These and any other suitable materials may be used for the substrate 421.

Fourth external connections 423 may be placed in contact with the substrate 421 and are used to provide connectivity between the substrate 421 and the other external devices. In an embodiment the fourth external connections 423 may be, for example, a ball grid array (BGA), although any suitable connection may be utilized. In an embodiment in which the fourth external connections 423 are a ball grid array, the fourth external connections 423 may comprise a material such as tin, or other suitable materials, such as silver, lead-free tin, or copper. In an embodiment in which the fourth external connections 423 are tin solder bumps, the fourth external connections 423 may be formed by initially forming a layer of tin through commonly used methods such as evaporation, electroplating, printing, solder transfer, ball placement, etc, to a thickness of, e.g., about 100 µm. Once a layer of tin has been formed on the structure, a reflow may be performed in order to shape the material into the desired bump shape with a diameter of, for example, between about 150 µm and about 350 µm, such as about 250 µm.

By forming the fourth semiconductor device 107 (e.g., an integrated voltage regulator) and the fifth semiconductor device 109 (e.g., an integrated voltage regulator) within the second encapsulant 419 along with the vias 111, and having them connected to the first semiconductor device 401 (e.g., a CPU), the second semiconductor device 403 (e.g., a CPU), and the third semiconductor device 405 (e.g., an I/O device), the fourth semiconductor device 107 and the fifth semiconductor device 109 may be placed closer than other solutions to the switching loads located within the first semiconductor device 401, the second semiconductor device 403, and the third semiconductor device 405. By reducing the physical distance between the voltage regulators and the switching loads, the IR drop issue that has plagued other structures may be resolved, thereby providing a system package solution for high efficiency CPU power management with a compact form factor and a reduced board area. Additionally, in embodiments in which the fourth semiconductor device 107 and the fifth semiconductor device 109 are voltage regulators and the first semiconductor device 401 and the second semiconductor device 403 are CPU cores, energy can be saved in such a multi-core CPU with a per-core voltage control.

Figure 5:
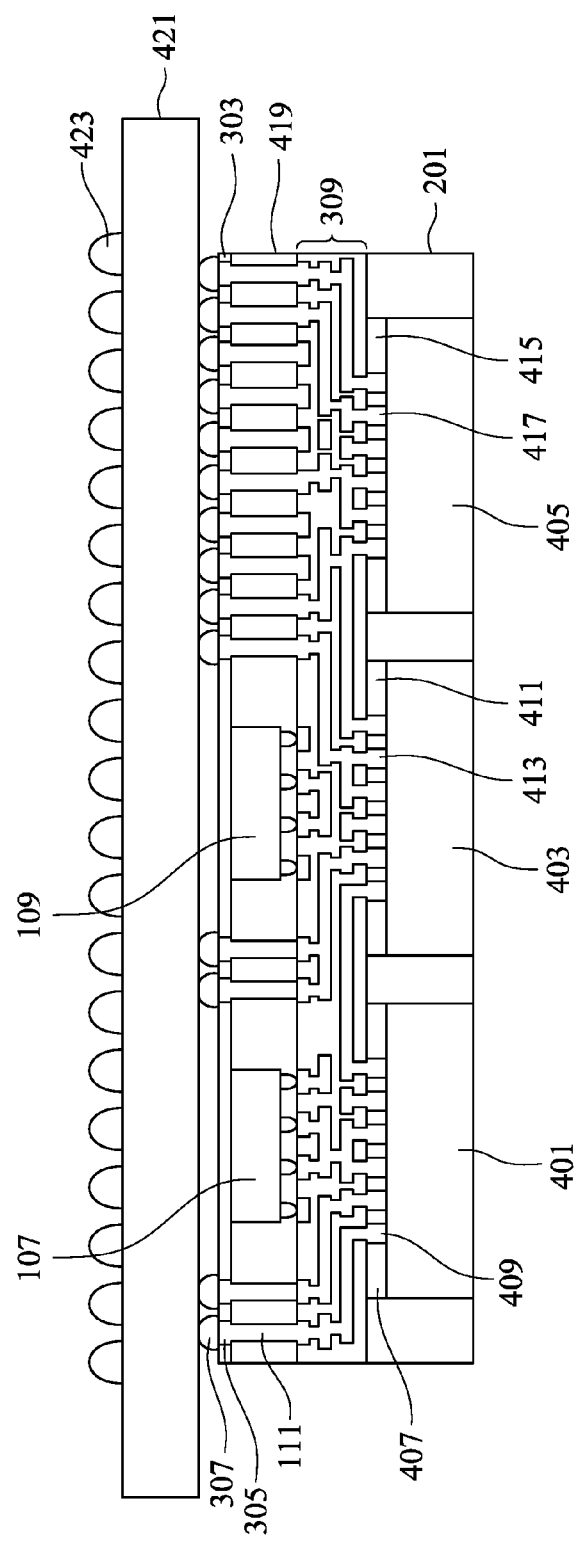
FIG. 5 illustrates integrated semiconductor devices with a single redistribution layer in accordance with some embodiments.

FIG. 5 illustrates another embodiment in which, rather than forming the second redistribution layer 301 in order to interconnect the vias 111 to the third external connectors 307, the third external connectors 307 are direct bonded over the vias 111 after the formation of the first redistribution layer contact pads 305 and the first redistribution layer passivation layer 303. In a particular embodiment, after the vias 111 have been exposed through the second encapsulant 419 (using, e.g., the CMP process), the first redistribution layer contact pads 305 are formed directly over and in physical connection with the exposed vias 111. Once the first redistribution layer contact pads 305 have been formed, the first redistribution layer passivation layer 303 is formed to protect the first redistribution layer contact pads 305 and the third external connectors 307 may be placed onto the first redistribution layer contact pads 305 through the first redistribution layer passivation layer 303. The substrate 421 may then be bonded to the third external connectors 307, thereby by-passing the use of the second redistribution layer 301.

By direct bonding the third external connectors 307 to the vias 111, the additional process steps and complications with forming the second redistribution layer 301 may be avoided in situations where the second redistribution layer 301 is not desired. By reducing the process steps and simplifying the manufacturing of the devices, the devices may be manufactured more efficiently and with fewer chances of defects.

Figure 6:
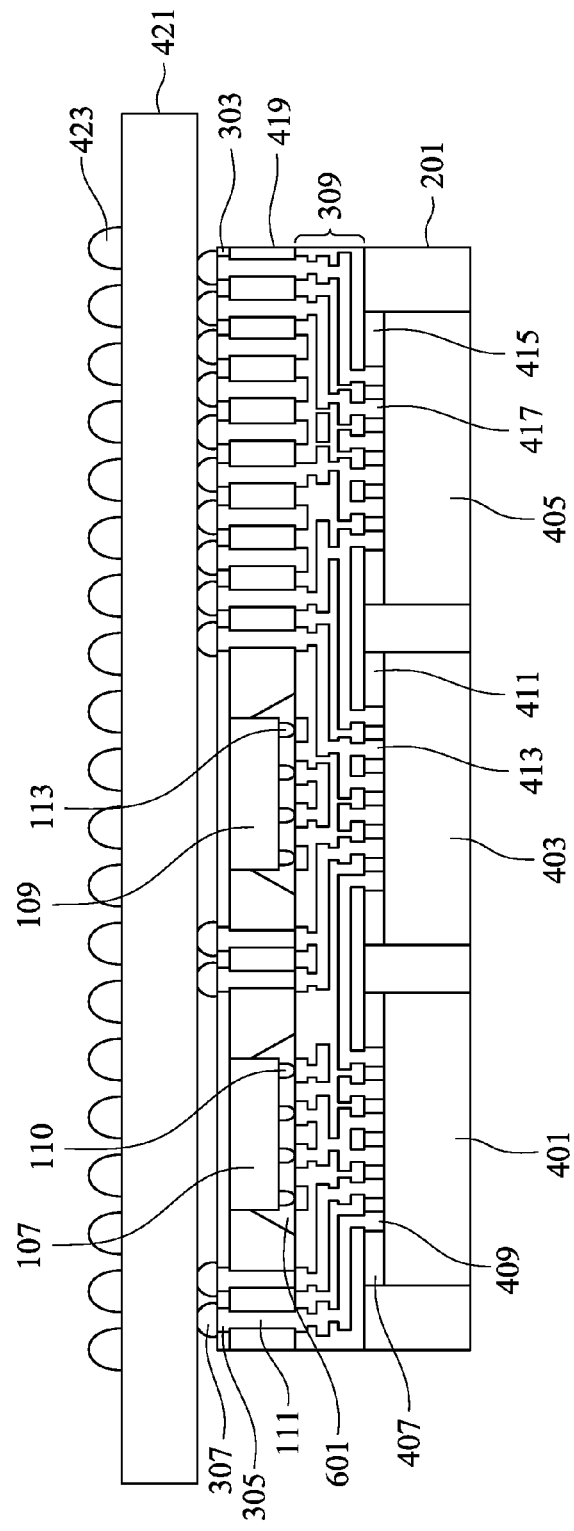
FIG. 6 illustrates integrated semiconductor devices with a single redistribution layer and an underfill material in accordance with some embodiments.

FIG. 6 illustrates an embodiment similar to the embodiment described above with respect to FIG. 5 and in which an first underfill material 601 is placed in order to protect the first external connectors 110 (on the fourth semiconductor device 107) and the second external connectors 113 (on the fifth semiconductor device 109). In an embodiment the first underfill material 601 is a protective material used to cushion and support the first external connectors 110 (on the fourth semiconductor device 107) and the second external connectors 113 (on the fifth semiconductor device 109) from operational and environmental degradation, such as stresses caused by the generation of heat during operation. The first underfill material 601 may comprise, for example, a liquid epoxy or other protective material, and then cured to harden. In an embodiment the first underfill material 601 may be placed after the fourth semiconductor device 107 and the fifth semiconductor device 109 have been placed and prior to encapsulation by dispensing the first underfill material 601 using, e.g., an injection process whereby the first underfill material 601 is injected in liquid form such that it flows around the first external connectors 110 (on the fourth semiconductor device 107) and the second external connectors 113 (on the fifth semiconductor device 109). Once the first underfill material 601 has been placed, the remainder of the process steps may be continued as described above.

By applying the first underfill material 601, the first external connectors 110 (on the fourth semiconductor device 107) and the second external connectors 113 (on the fifth semiconductor device 109) can be better protected from the subsequent processing steps. For example, the first underfill material 601 may provide additional structural support as well as additional isolation for the first external connectors 110 (on the fourth semiconductor device 107) and the second external connectors 113 (on the fifth semiconductor device 109). Such additional support and protection will reduce or eliminate structural failures of the first external connectors 110 (on the fourth semiconductor device 107) and the second external connectors 113 (on the fifth semiconductor device 109).

Figure 7:
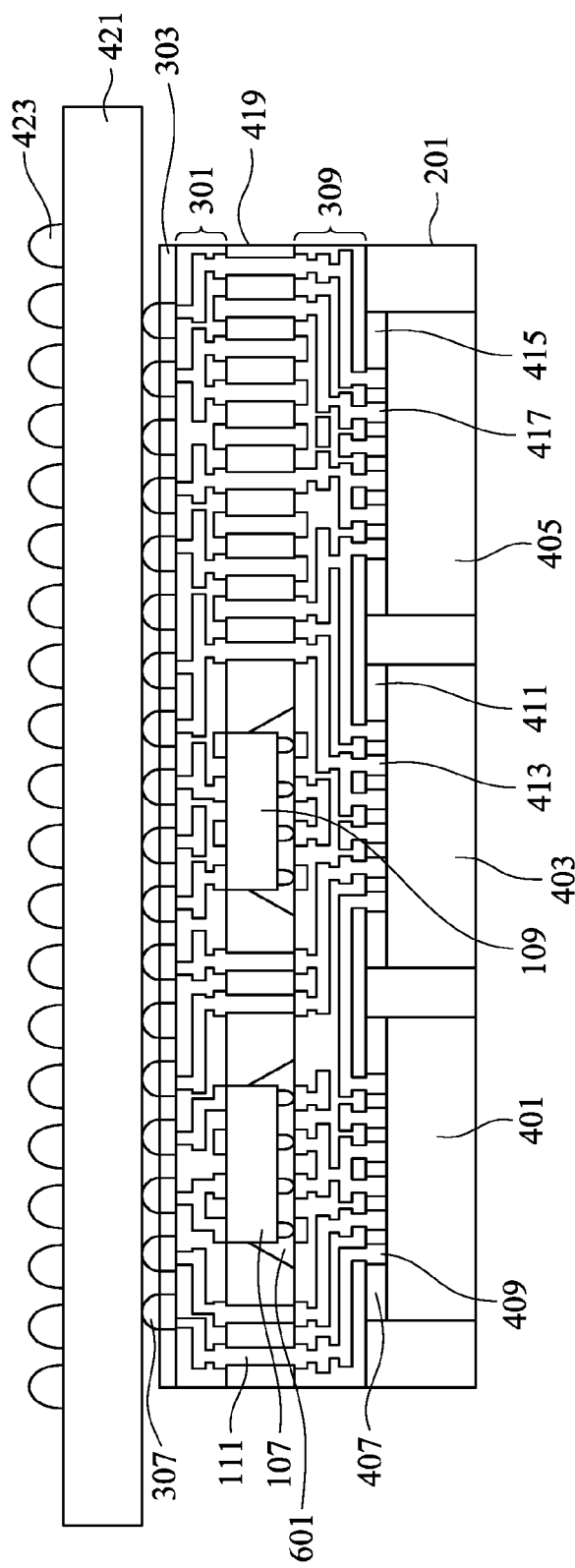
FIG. 7 illustrates integrated semiconductor devices with multiple redistribution layers and an underfill in accordance with some embodiments.

FIG. 7 illustrates an embodiment similar to the embodiment described above with respect to FIGS. 1A-4, in which the second redistribution layer 301 is formed to help interconnect the vias 111. In this embodiment, however, the first underfill material 601 is dispensed prior to the encapsulation of the fourth semiconductor device 107 and the fifth semiconductor device 109. The first underfill material 601 in this embodiment may be as described above with respect to FIG. 6, such as by being a liquid epoxy or other protective material dispensed in liquid form using an injection process. However, any suitable material or method of dispensing may be used. Once the first underfill material 601 has been placed, the remainder of the process steps may be continued as described above.

By applying the first underfill material 601, the first external connectors 110 (on the fourth semiconductor device 107) and the second external connectors 113 (on the fifth semiconductor device 109) can be better protected from the subsequent processing steps. For example, the first underfill material 601 may provide additional structural support as well as additional isolation for the first external connectors 110 (on the fourth semiconductor device 107) and the second external connectors 113 (on the fifth semiconductor device 109). Such additional support and protection will reduce or eliminate structural failures of the first external connectors 110 (on the fourth semiconductor device 107) and the second external connectors 113 (on the fifth semiconductor device 109).

Figure 8:
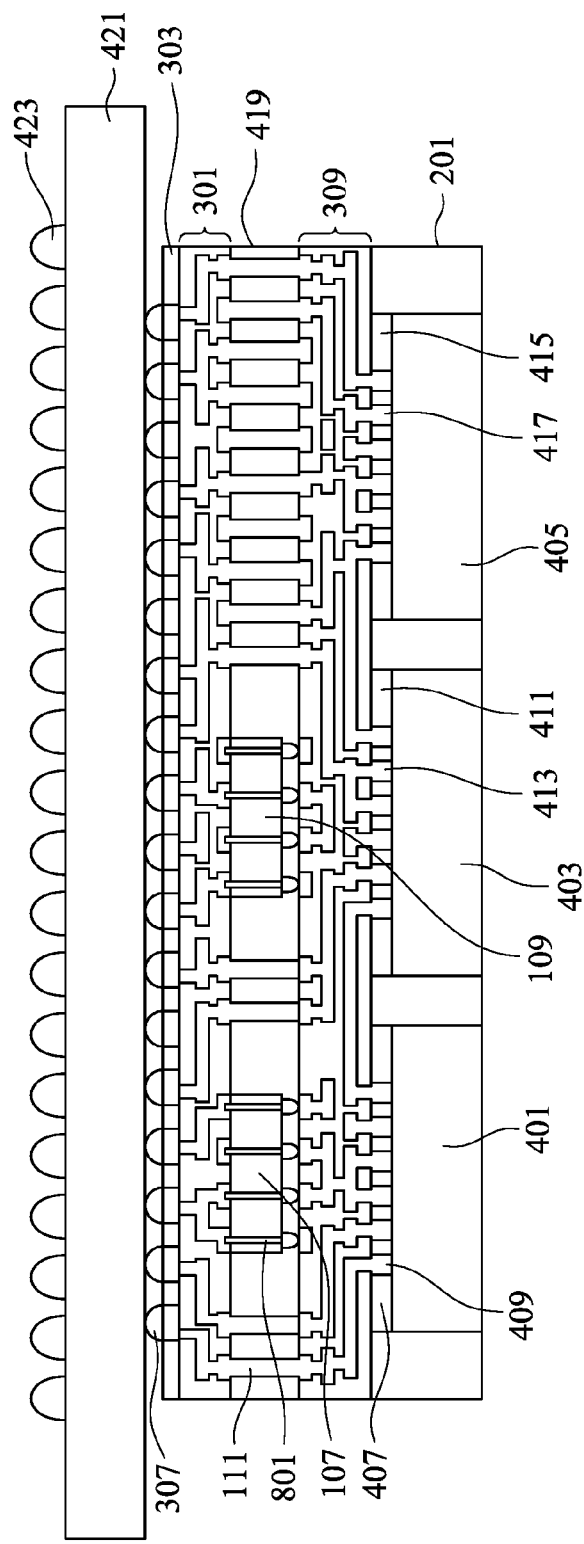
FIG. 8 illustrates integrated semiconductor devices with multiple redistribution layers and through silicon vias extending through the multiple redistribution layers in accordance with some embodiments.

FIG. 8 illustrates another embodiment similar to the embodiment discussed above with respect to FIG. 4. However, in this embodiment, through silicon vias (TSVs) 801 are formed through the fourth substrate of the fourth semiconductor device 107 and the fifth substrate of the fifth semiconductor device 109. Looking first at the fourth semiconductor device 107, in an embodiment the TSVs 801 may be formed by initially forming through silicon via (TSV) openings into the fourth substrate of the fourth semiconductor device 107. The TSV openings may be formed by applying and developing a suitable photoresist (not shown), and removing portions of the fourth substrate of the fourth semiconductor device 107 that are exposed to the desired depth. The TSV openings may be formed so as to extend into the fourth substrate of the fourth semiconductor device 107 at least further than the fourth active devices formed within and/or on the fourth substrate of the fourth semiconductor device 107, and may extend to a depth greater than the eventual desired height of the fourth substrate of the fourth semiconductor device 107. Accordingly, while the depth is dependent upon the overall designs, the depth may be between about 20 μm and about 200 μm from the fourth active devices on the fourth substrate of the fourth semiconductor device 107, such as a depth of about 50 μm from the fourth active devices on the fourth substrate of the fourth semiconductor device 107.

Once the TSV openings have been formed within the fourth substrate of the fourth semiconductor device 107, the TSV openings may be lined with a liner. The liner may be, e.g., an oxide formed from tetraethylorthosilicate (TEOS) or silicon nitride, although any suitable dielectric material may alternatively be used. The liner may be formed using a plasma enhanced chemical vapor deposition (PECVD) process, although other suitable processes, such as physical vapor deposition or a thermal process, may alternatively be used. Additionally, the liner may be formed to a thickness of between about 0.1 μm and about 5 μm, such as about 1 μm.

Once the liner has been formed along the sidewalls and bottom of the TSV openings, a barrier layer (also not independently illustrated) may be formed and the remainder of the TSV openings may be filled with a first conductive material. The first conductive material may comprise copper, although other suitable materials such as aluminum, alloys, doped polysilicon, combinations thereof, and the like, may alternatively be utilized. The first conductive material may be formed by electroplating copper onto a third seed layer (not shown), filling and overfilling the TSV openings. Once the TSV openings have been filled, excess liner, barrier layer, third seed layer, and first conductive material outside of the TSV openings may be removed through a planarization process such as chemical mechanical polishing (CMP), although any suitable removal process may be used.

Once the TSV openings have been filled, a backside of the fourth substrate of the fourth semiconductor device 107 may be thinned to expose the TSV openings and form the TSVs 801. In an embodiment the fourth substrate of the fourth semiconductor device 107 may be thinned using, e.g., a CMP and grinding process to remove the material of the fourth substrate of the fourth semiconductor device 107 as well as planarize the fourth substrate of the fourth semiconductor device 107 and the TSVs 801 once the TSVs 801 have been exposed. In another embodiment, one or more etching processes or other removal processes may also be used to remove material of the fourth substrate and to expose the TSVs 801.

With respect to the TSVs 801 through the fifth substrate of the fifth semiconductor device 109, a similar process may be utilized to form the TSVs 801 through the fifth semiconductor device 109. For example, an opening may be formed within the fifth substrate, the opening may be lined and filled with conductive material, and the fifth substrate may be thinned in order to expose the conductive material. However, any suitable process or processes for forming the TSVs 801 through the fourth semiconductor device 107 and the fifth semiconductor device 109 may be utilized.

Once the TSVs 801 have been formed in the fourth semiconductor device 107 and the fifth semiconductor device 109 (and any other desired processing, such as a formation of the active devices or metallization layers have been performed), the fourth semiconductor device 107 and the fifth semiconductor device 109 may be placed and encapsulated with the vias 111 as described above with respect to FIGS. 2A-3. Additionally, the second redistribution layer 301 may be formed over the fourth semiconductor device 107, the fifth semiconductor device 109, and the second encapsulant 419. However, in this embodiment the second redistribution layer 301, rather than re-routing the vias 111, will also be electrically connected with the TSVs 801 through the fourth semiconductor device 107 and the fifth semiconductor device 109. As such, the second redistribution layer 301 may also be used to interconnect the fourth semiconductor device 107, the fifth semiconductor device 109, and the vias 111.

By forming the TSVs 801 through the fourth semiconductor device 107 and the fifth semiconductor device 109, additional routing options may be provided. Additionally, the fourth semiconductor device 107 and the fifth semiconductor device 109 may be connected to the second redistribution layer 301. With such options, a more efficient layout and connection pattern may be designed and achieved, and an overall more efficient device may be obtained.

Figure 9:
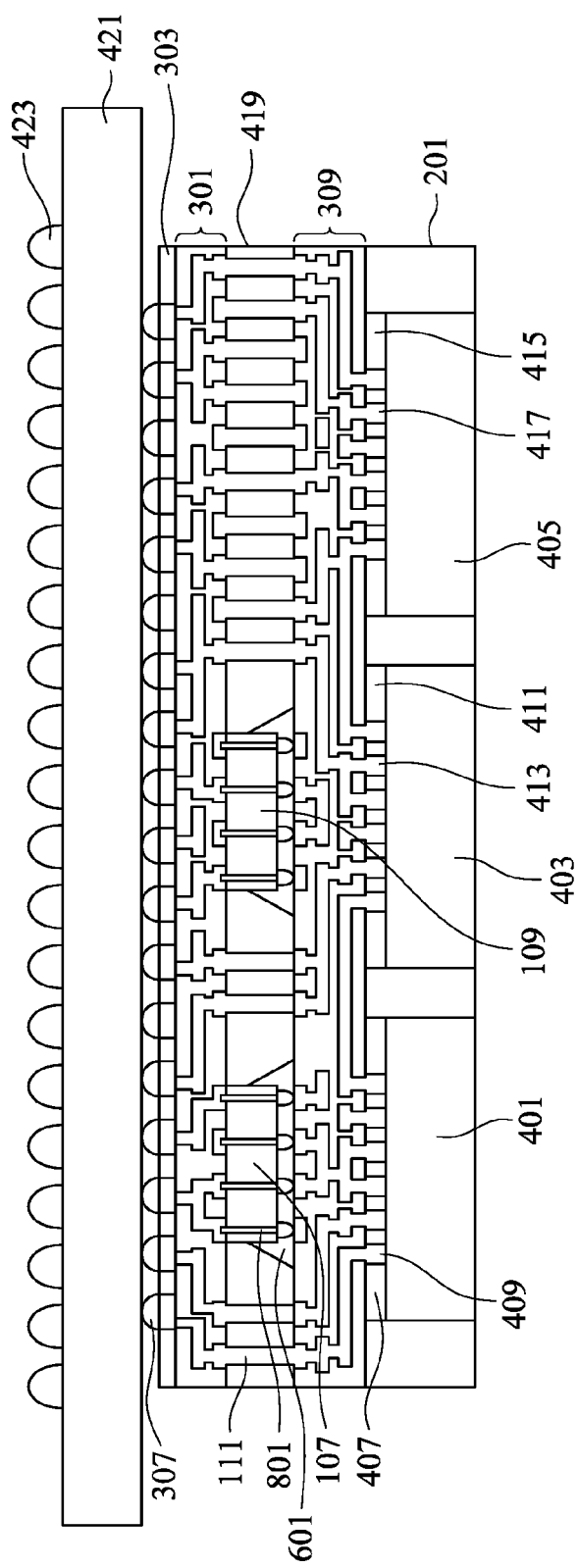
FIG. 9 illustrates integrated semiconductor devices with multiple redistribution layers and through silicon vias extending through the multiple redistribution layers along with an underfill material in accordance with some embodiments.

FIG. 9 illustrates another embodiment in which the TSVs 801 are formed through the fourth semiconductor device 107 and the fifth semiconductor device 109 and the second redistribution layer 301 is electrically connected to the TSVs 801. In this embodiment, in addition to the TSVs 801, the first underfill material 601 is placed in order to help protect and support the fourth semiconductor device 107 and the fifth semiconductor device 109. The first underfill material 601 in this embodiment may be as described above with respect to FIG. 6, such as by being a liquid epoxy or other protective material dispensed in liquid form using an injection process. However, any suitable material or method of dispensing may be used.

By applying the first underfill material 601, the first external connectors 110 (on the fourth semiconductor device 107) and the second external connectors 113 (on the fifth semiconductor device 109) can be better protected from the subsequent processing steps. For example, the first underfill material 601 may provide additional structural support as well as additional isolation for the first external connectors 110 (on the fourth semiconductor device 107) and the second external connectors 113 (on the fifth semiconductor device 109). Such additional support and protection will reduce or eliminate structural failures of the first external connectors 110 (on the fourth semiconductor device 107) and the second external connectors 113 (on the fifth semiconductor device 109).

Figure 10:
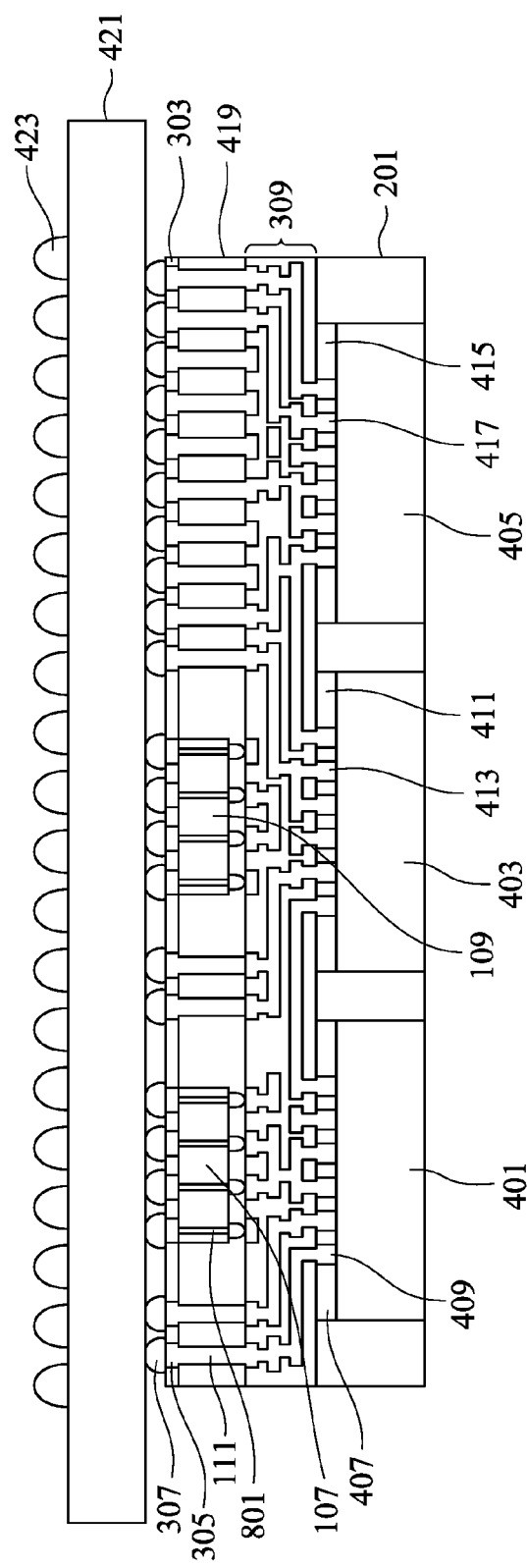
FIG. 10 illustrates integrated semiconductor devices with a single redistribution layer along with through silicon vias extending through the multiple redistribution layers in accordance with some embodiments.

FIG. 10 illustrates another embodiment in which the TSVs 801 are formed through the fourth semiconductor device 107 and the fifth semiconductor device 109. In this embodiment, in addition to the formation of the TSVs 801 (as described above with respect to FIG. 8), the second redistribution layer 301 is not formed, and the third external connectors 307 are direct bonded with the vias 111 (through, e.g., the first redistribution layer contact pads 305) as well as directed bonded with the TSVs 801. For example, the first redistribution layer contact pads 305 may be formed in electrical and/or physical connection with the TSVs 801, and the third external connectors 307 are placed directly over and in electrical connection with the first redistribution layer contact pads 305.

By direct bonding the third external connectors 307 to the vias 111 and also to the TSVs 801, the additional process steps and complications with forming the second redistribution layer 301 may be avoided in situations where the second redistribution layer 301 is not desired. By reducing the process steps and simplifying the manufacturing of the devices, the devices may be manufactured more efficiently and with less chances of defects.

Figure 11:
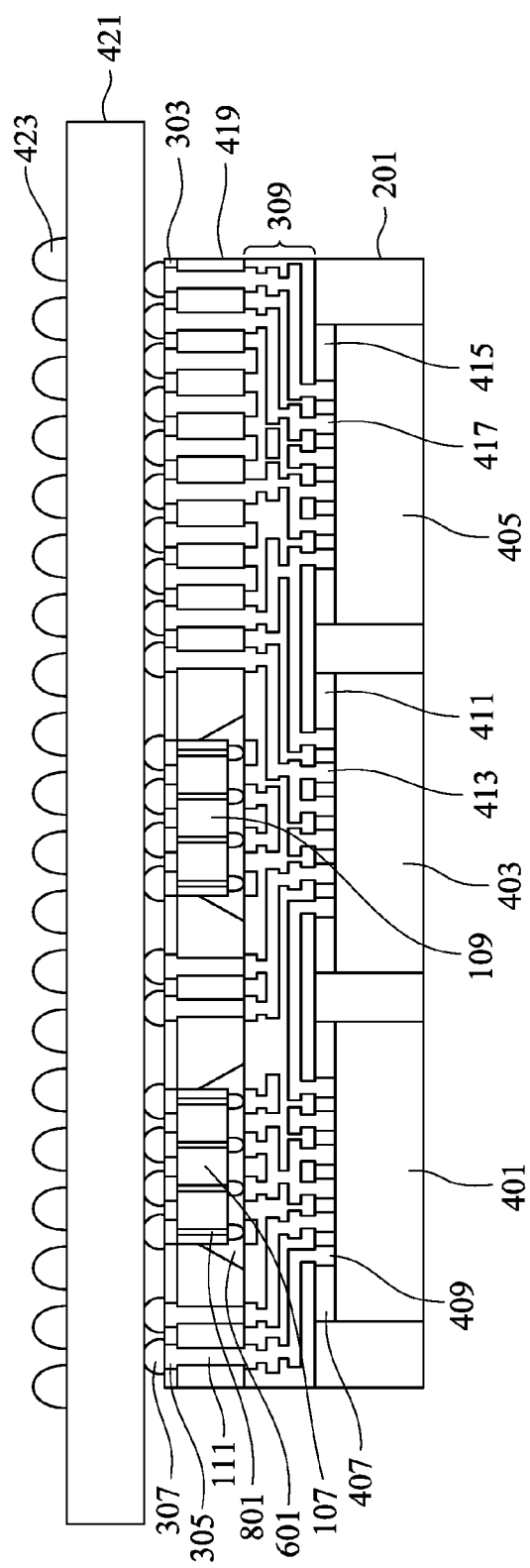
FIG. 11 illustrates integrated semiconductor devices with a single redistribution layer along with through silicon vias extending through the multiple redistribution layers and an underfill material in accordance with some embodiments.

FIG. 11 illustrates another embodiment similar to the embodiment in FIG. 10 in which the TSVs 801 are formed through the fourth semiconductor device 107 and the fifth semiconductor device 109 and the third external connectors 307 are direct bonded to the vias 111 and the TSVs 801. In this embodiment, however, the first underfill material 601 is also dispensed prior to the encapsulation of the fourth semiconductor device 107 and the fifth semiconductor device 109. The first underfill material 601 in this embodiment may be as described above with respect to FIG. 6, such as by being a liquid epoxy or other protective material dispensed in liquid form using an injection process. However, any suitable material or method of dispensing may be used. Once the first underfill material 601 has been placed, the remainder of the process steps may be continued as described above.

By applying the first underfill material 601, the first external connectors 110 (on the fourth semiconductor device 107) and the second external connectors 113 (on the fifth semiconductor device 109) can be better protected from the subsequent processing steps. For example, the first underfill material 601 may provide additional structural support as well as additional isolation for the first external connectors 110 (on the fourth semiconductor device 107) and the second external connectors 113 (on the fifth semiconductor device 109) in chosen directions. Such additional support and protection will reduce or eliminate structural failures of the first external connectors 110 (on the fourth semiconductor device 107) and the second external connectors 113 (on the fifth semiconductor device 109).

Figure 12:
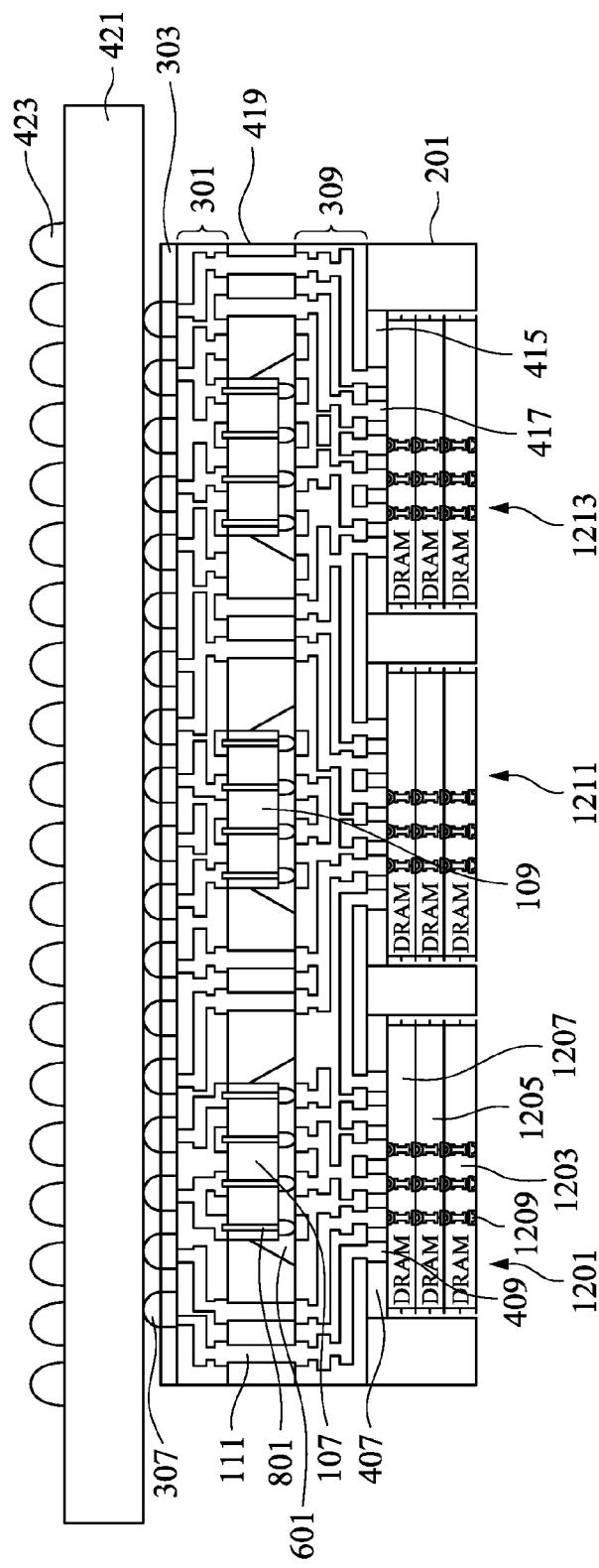
FIG. 12 illustrates integrated semiconductor devices with stack of dies in accordance with some embodiments.

FIG. 12 illustrates yet another embodiment in which the first semiconductor device 401, the second semiconductor device 403, or the third semiconductor device 405, or all three of them, are die stacks which comprises a plurality of individual dies. In an embodiment the first semiconductor device 401 may be replaced by a first die stack 1201 which may comprises a first die 1203, a second die 1205, and a third die 1207 that are interconnected to each other through the use of third TSVs 1209. In a particular embodiment each of the first die 1203, the second die 1205, and the third die 1207 may be, e.g., memory dies, such as DRAM dies or high bandwidth memory dies, although the first die 1203, the second die 1205, and the third die 1207 may provide any desired functionality. Each of the first die 1203, the second die 1205, and the third die 1207 may be formed using similar structures and methods as described above with respect to the first semiconductor device 401 and, once formed, the first die 1203, the second die 1205, and the third die 1207 may be bonded to each other prior to being placed and encapsulated.

Similarly, the second semiconductor device 403 may be replaced by a second die stack 1211, and the third semiconductor device 405 may be replaced by a third die stack 1213. Any suitable combination of die stacks and other semiconductor devices may be utilized, and all such combinations are fully intended to be included within the scope of the invention.

Figure 13A:
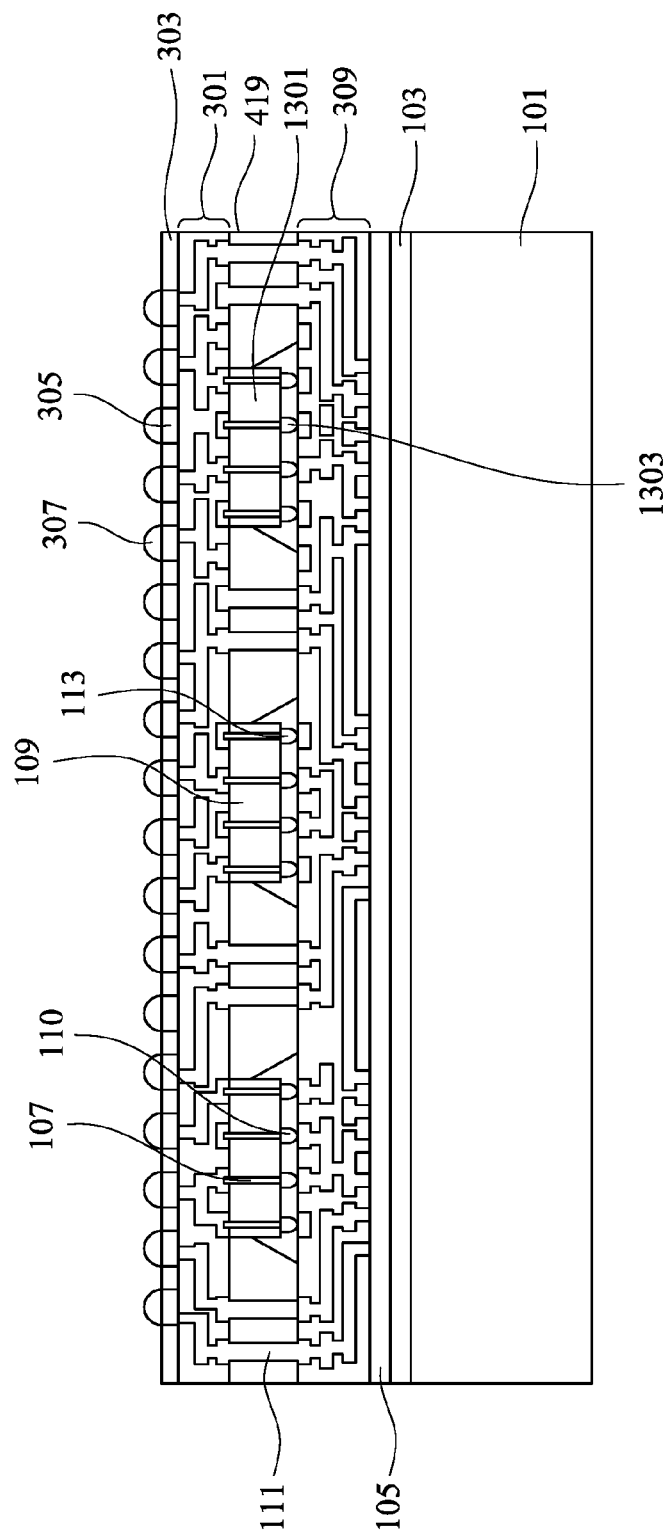
FIGS. 13A-13B illustrate an embodiment in which the first semiconductor device, the second semiconductor device, and the third semiconductor device are attached last.
Figure 13B:
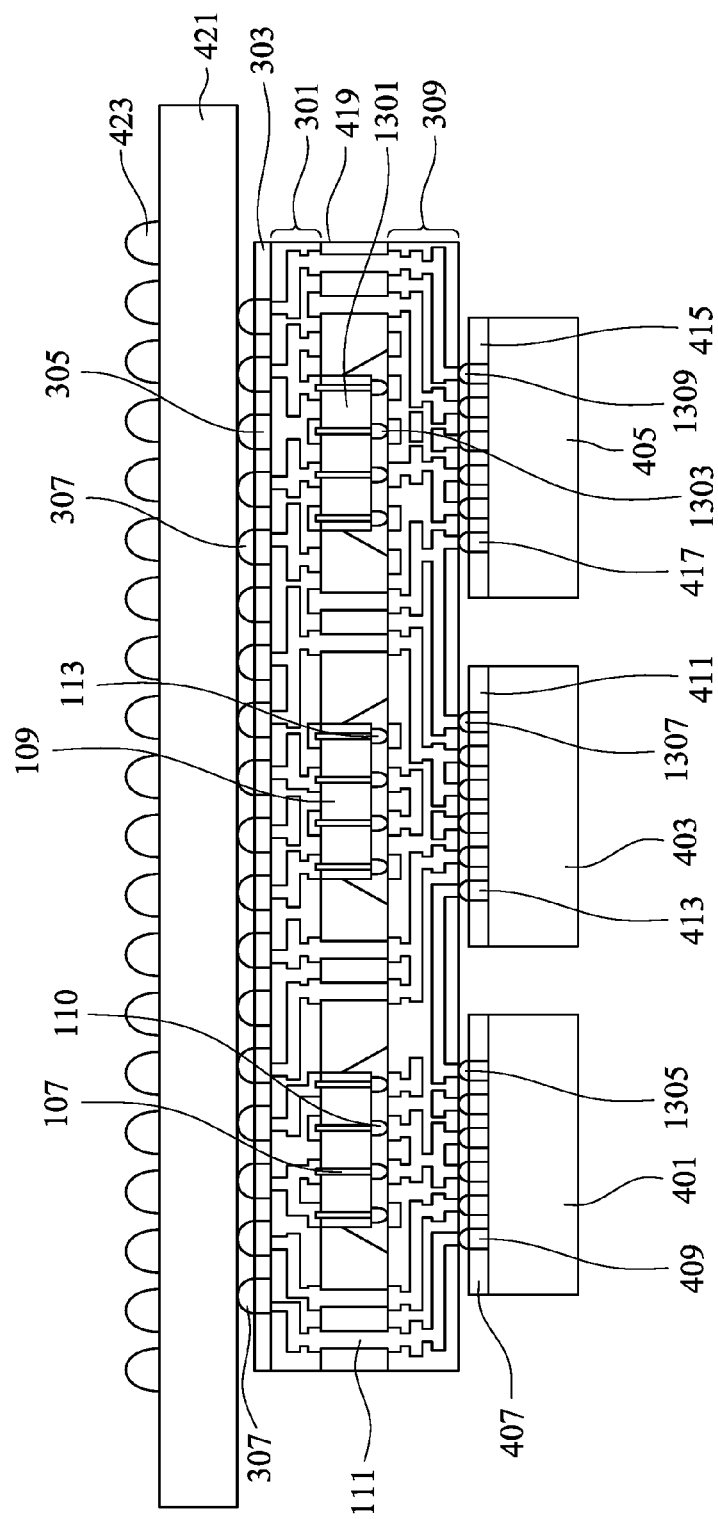

FIGS. 13A-13B illustrate another embodiment in which the first redistribution layer 309 is formed and the fourth semiconductor device 107 along with the fifth semiconductor device 109 are placed prior to the placement and encapsulation of the first semiconductor device 401, the second semiconductor device 403, and the third semiconductor device 405. In an embodiment a polymer layer 105 is formed on the adhesive layer 103 and may be polybenzoxazole (PBO), although any suitable material, such as polyimide or a polyimide derivative, may alternatively be utilized. The polymer layer 105 may be placed using, e.g., a spin-coating process to a thickness of between about 0.5 µm and about 10 µm, such as about 5 µm, although any suitable method and thickness may alternatively be used.

Once the polymer layer 105 has been formed, the first redistribution layer 309 may be formed on the polymer layer 105. In an embodiment the first redistribution layer 309 may be formed as described above with respect to FIG. 1. For example, a plurality of conductive and dielectric layers may be formed using deposition and photolithographic masking and etching processes. However, any suitable process for forming the first redistribution layer 309 may be utilized.

Once the first redistribution layer 309 has been formed over the first carrier substrate 101, the vias 111 may be formed and the fourth semiconductor device 107 and the fifth semiconductor device 109 are placed within the vias 111 after the vias 111 have been formed as described above with respect to FIG. 2A. Additionally in this embodiment, a sixth semiconductor device 1301 may also be placed on the first redistribution layer 309 along with the fourth semiconductor device 107 and the fifth semiconductor device 109. In an embodiment the sixth semiconductor device 1301 may be another voltage regulator and may comprise a sixth substrate, sixth active devices, sixth metallization layers, third contact pads, a sixth passivation layer (not separately illustrated in FIG. 13A), and third external connectors 1303. In an embodiment the sixth substrate, the sixth active devices, the sixth metallization layers, the third contact pads, the sixth passivation layer, and the third external connectors 1303 may be similar to the fourth substrate, the fourth active devices, the fourth metallization layers, the first contact pads, the fourth passivation layer, and the first external connectors 110, although they may also be different.

FIG. 13A additionally illustrates an encapsulation of the fourth semiconductor device 107, the fifth semiconductor device 109, and the sixth semiconductor device 1301, along with the formation of the second redistribution layer 301, the first redistribution layer contact pads 305, the first redistribution layer passivation layer 303, and the third external connectors 307. In an embodiment the fourth semiconductor device 107, the fifth semiconductor device 109, and the sixth semiconductor device 1301, along with the vias 111, may be encapsulated, and the second redistribution layer 301, the first redistribution layer contact pads 305, and the third external connectors 307 may be formed as described above with respect to FIG. 3. However, any suitable process or processes may be utilized.

FIG. 13B illustrates that, once the third external connectors 307 have been formed, the first carrier substrate 101 may be removed. In an embodiment the first carrier substrate 101 may be removed as described above with respect to FIG. 3. For example, the adhesive layer may be treated to lower its adhesion, and then the first carrier substrate 101 and the adhesion layer 103 may be removed. Additionally at this stage, if desired, the polymer layer 105 may also be removed as well using, e.g., a wet etch process.

Once the first carrier substrate 101 has been removed, the first semiconductor device 401, the second semiconductor device 403, and the third semiconductor device 405 may be placed and connected to the first redistribution layer 309. In an embodiment, prior to connection of the first semiconductor device 401, the second semiconductor device 403, and the third semiconductor device 405, fourth external connectors 1305 may be placed on the first semiconductor device 401, fifth external connectors 1307 may be placed on the second semiconductor device 403, and sixth external connectors 1309 may be placed on the third semiconductor device 405. In an embodiment the fourth external connectors 1305, the fifth external connectors 1307, and the sixth external connectors 1309 may be microbumps which comprise a eutectic material such as solder, although any suitable materials may alternatively be used. In an embodiment in which the fourth external connectors 1305, the fifth external connectors 1307, and the sixth external connectors 1309 are microbumps, the fourth external connectors 1305, the fifth external connectors 1307, and the sixth external connectors 1309 may be formed using a ball drop method, such as a direct ball drop process. In another embodiment the microbumps may be formed by initially forming a layer of tin through any suitable method such as evaporation, electroplating, printing, solder transfer, and then performing a reflow in order to shape the material into the desired bump shape. In an embodiment in which the fourth external connectors 1305, the fifth external connectors 1307, and the sixth external connectors 1309 are microbumps, the first external connectors 110 may have a diameter of between about 20 μm and about 50 μm.

Once the fourth external connectors 1305, the fifth external connectors 1307, and the sixth external connectors 1309 have been placed or formed on the first semiconductor device 401, the second semiconductor device 403, and the third semiconductor device 405, the first semiconductor device 401, the second semiconductor device 403, and the third semiconductor device 405 may be aligned and bonded to the first redistribution layer 309. In an embodiment in which the fourth external connectors 1305, the fifth external connectors 1307, and the sixth external connectors 1309 are microbumps, the first semiconductor device 401, the second semiconductor device 403, and the third semiconductor device 405 may be bonded by aligning the fourth external connectors 1305, the fifth external connectors 1307, and the sixth external connectors 1309 on the desired exposed portions of the first redistribution layer 309 and then performing a reflow to bond the first semiconductor device 401, the second semiconductor device 403, and the third semiconductor device 405 to the first redistribution layer 309.

Alternatively, the first semiconductor device 401, the second semiconductor device 403, and the third semiconductor device 405 may be bonded to the first redistribution layer 309 using a fusion bonding process or a hybrid bonding process. In these processes, the fourth external connectors 1305, the fifth external connectors 1307, and the sixth external connectors 1309 are not utilized, and the first passivation layer 407, the second passivation layer 411, and the third passivation layer 415 are directly bonded to the dielectric portions of the first redistribution layer 309 (in a fusion bonding process) or else the first vias 409, the second vias 413, and the third vias 417 (in addition to the first passivation layer 407, the second passivation layer 411, and the third passivation layer 415) are directly bonded to the first redistribution layer 309 in a hybrid fusion bonding process. However, any suitable process may be utilized to bond the first semiconductor device 401, the second semiconductor device 403, and the third semiconductor device 405 to the first redistribution layer 309.

Once the first semiconductor device 401, the second semiconductor device 403, and the third semiconductor device 405 have been bonded to the first redistribution layer 309, the third external connectors 307 may be bonded to the substrate 421. In an embodiment the third external connectors 307 are bonded to the substrate 421 as described above with respect to FIG. 4. However, any suitable method may be utilized.

Figure 14:
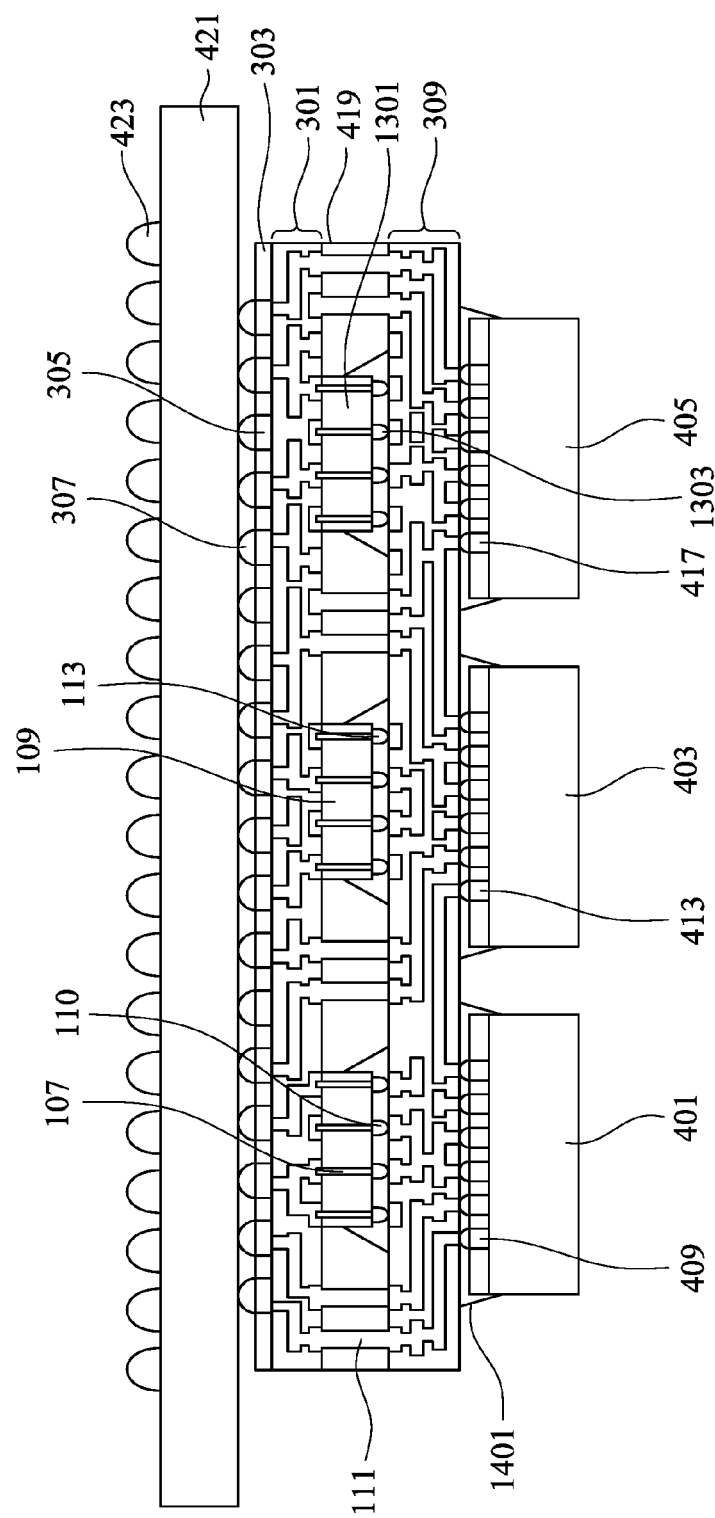
FIG. 14 illustrates a placement of an underfill material in accordance with some embodiments.

FIG. 14 illustrates a placement of a second underfill material 1401 between the first redistribution layer 309 and each of the first semiconductor device 401, the second semiconductor device 403, and the third semiconductor device 405. In an embodiment the second underfill material 1401 may be a similar material and dispensed using a similar process as the first underfill material 601 (described above with respect to FIG. 6). For example, the second underfill material 1401 may be an epoxy material dispensed through an injection process. However, any suitable material or method of dispensation may be utilized.

Additionally in the embodiment illustrated in FIG. 14, after the second underfill material 1401 has been dispensed, there is no encapsulation of the first semiconductor device 401, the second semiconductor device 403, and the third semiconductor device 405. Rather, the first semiconductor device 401, the second semiconductor device 403, and the third semiconductor device 405 remain unencapsulated, with sidewalls of the first semiconductor device 401, the second semiconductor device 403, and the third semiconductor device 405 being free from an encapsulating material.

Figure 15:
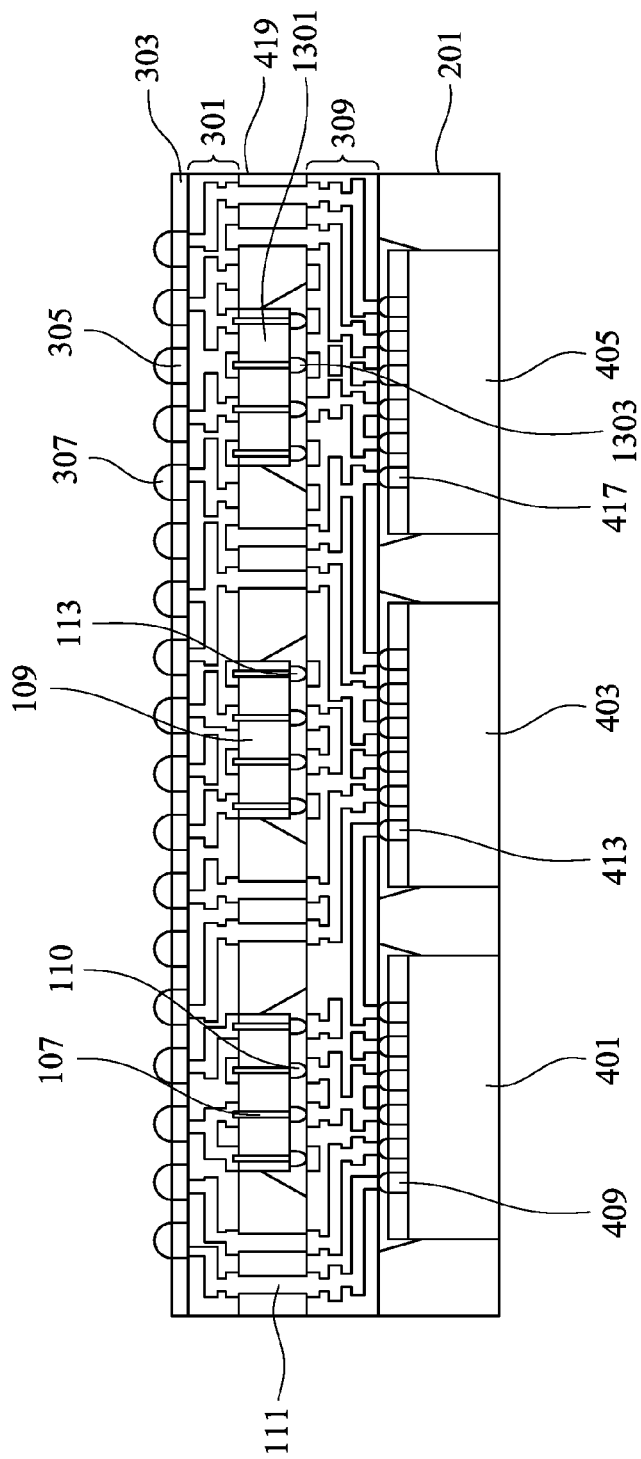
FIG. 15 illustrates an encapsulation of the first semiconductor device, the second semiconductor device, and the third semiconductor device in accordance with some embodiments.

FIG. 15 illustrates another embodiment in which the first semiconductor device 401, the second semiconductor device 403, and the third semiconductor device 405 are encapsulated with the first encapsulant 201. In an embodiment the first semiconductor device 401, the second semiconductor device 403, and the third semiconductor device 405 are encapsulated as described above with respect to the encapsulation of the first semiconductor device 401, the second semiconductor device 403, and the third semiconductor device 405 in FIG. 1. For example, the first semiconductor device 401, the second semiconductor device 403, and the third semiconductor device 405 (along with the fourth semiconductor device 107, the fifth semiconductor device 109, and the sixth semiconductor device 1301) may be placed into a molding chamber (not separately illustrated) and the first encapsulant 201 may be placed over the first semiconductor device 401, the second semiconductor device 403, and the third semiconductor device 405. Once in place, if desired, the first encapsulant 201, the first semiconductor device 401, the second semiconductor device 403, and the third semiconductor device 405 may be planarized using, e.g., a CMP process until the first semiconductor device 401, the second semiconductor device 403, and the third semiconductor device 405 are exposed. However, any suitable process may be used to encapsulate the first semiconductor device 401, the second semiconductor device 403, and the third semiconductor device 405.

Figure 16:
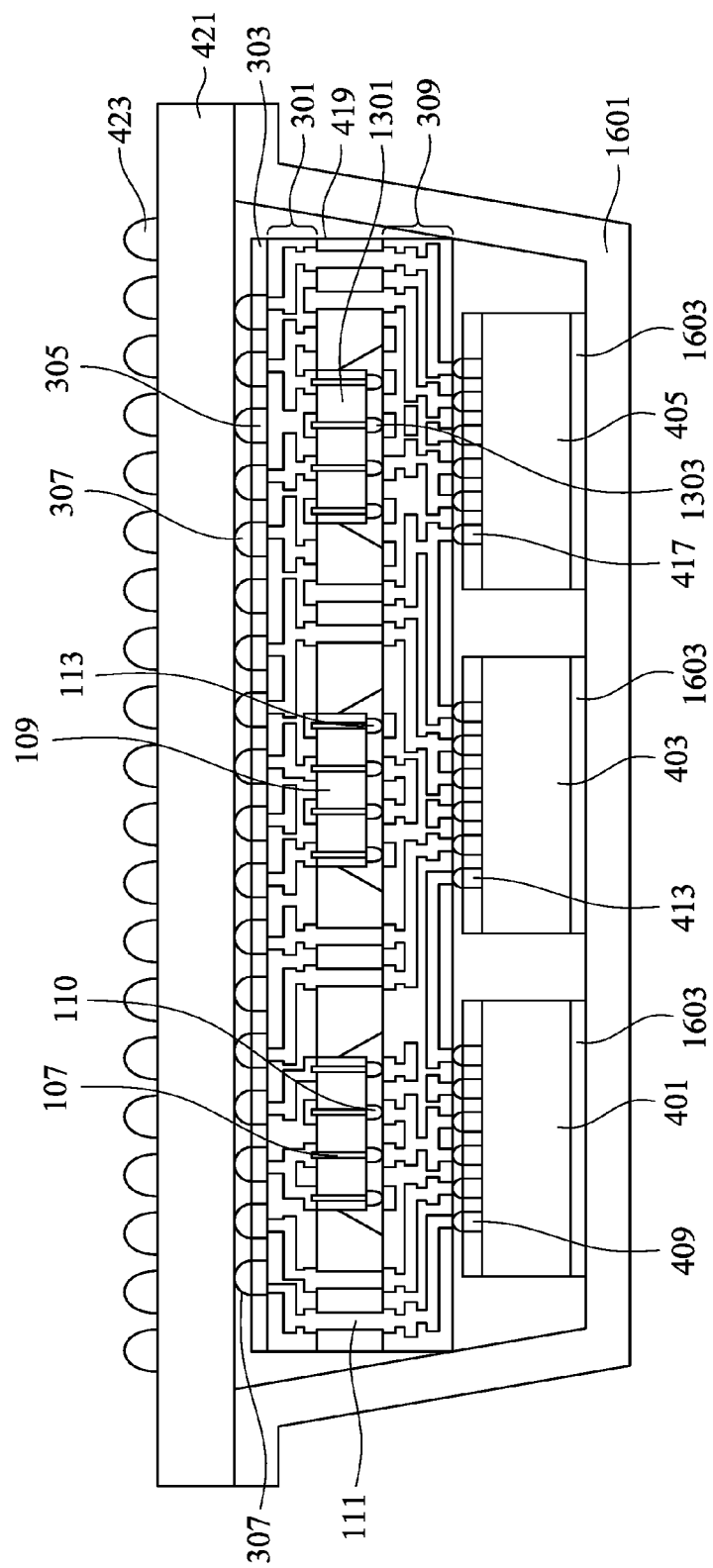
FIG. 16 illustrates a placement of a heat spreader in accordance with some embodiments.

FIG. 16 illustrates another embodiment in which the first encapsulant 201 is not utilized to encapsulate the first semiconductor device 401, the second semiconductor device 403, and the third semiconductor device 405. In this embodiment a heat spreader 1601 may be placed over the first semiconductor device 401, the second semiconductor device 403, and the third semiconductor device 405 in order to help protect the first semiconductor device 401, the second semiconductor device 403, and the third semiconductor device 405 as well as to remove heat that is generated during operation of the first semiconductor device 401, the second semiconductor device 403, and the third semiconductor device 405. In an embodiment the heat spreader 1601 may be attached to the first semiconductor device 401, the second semiconductor device 403, and the third semiconductor device 405 using, e.g., a first thermal interface material 1603. The first thermal interface material 1603 comprises an epoxy, silicone, an inorganic material such as a lightly cross-linked silicone polymer, one or more matrix polymers, a polymer with one or more thermally conductive fillers, other materials, or multiple layers or combinations thereof in some embodiments, as examples. In embodiments wherein the first thermal interface material 1603 comprises a matrix polymer, the matrix polymer may comprise ethylene-propylene, an ethylene-propylene-diene monomer, hydrogenated polyisoprene, or a combination thereof. In embodiments wherein the first thermal interface material 1603 includes a thermally conductive filler, the thermally conductive filler may include aluminum oxide, boron nitride, aluminum nitride, aluminum, copper, silver, indium, or a combination thereof. The thermally conductive filler is dispersed within the first thermal interface material 1603 and has a percentage weight within the first thermal interface material 1603 of about 10 weight percent to about 90 weight percent in some embodiments, for example. Alternatively, the first thermal interface material 1603 may comprise other materials, filler, and properties. The first thermal interface material 1603 is used to improve electrical and/or thermal conduction by filling in microscopic air pockets created between minutely uneven surfaces, such as the region between surfaces of the first semiconductor device 401, the second semiconductor device 403, and the third semiconductor device 405 and the heat spreader 1601.

In some embodiments, the first semiconductor device 401, the second semiconductor device 403, and the third semiconductor device 405 may be electrically and thermally connected to the heat spreader 1601 and eventually to a heat sink (not separately illustrated in FIG. 16). For such an example, a metal-based thermal paste containing silver, nickel, or aluminum particles suspended in the silicone grease may be used. In alternative embodiments where the first semiconductor device 401, the second semiconductor device 403, and the third semiconductor device 405 may only want thermal conduction to the heat sink, non-electrically conductive, ceramic-based pastes, filled with ceramic powders such as beryllium oxide, aluminum nitride, aluminum oxide, or zinc oxide, may be applied. Moreover, some embodiments may not utilize the first thermal paste.

In some embodiments, the heat spreader 1601 may be deployed to supply electrical and/or thermal pathways for the first semiconductor device 401, the second semiconductor device 403, and the third semiconductor device 405 to spread the heat generated from the first semiconductor device 401, the second semiconductor device 403, and the third semiconductor device 405 over a larger area, especially for high power applications. In an embodiment the heat spreader 1601 may comprise copper, aluminum, other metals, alloys, combinations thereof, or other material of high electrical and thermal conductivities. In additional, the heat spreader may attach from the first semiconductor device 401, the second semiconductor device 403, and the third semiconductor device 405 to the top surface of the substrate 421 to establish electrical connections to the substrate 421.

A heat sink may be mounted over and thermally coupled to the heat spreader and the first semiconductor device 401, the second semiconductor device 403, and the third semiconductor device 405. The heat sink may be formed using materials exhibiting high thermal conductivity such as aluminum, copper, diamond, other metals, alloys, combinations thereof, and the like. The heat sink aids in the cooling of the first semiconductor device 401, the second semiconductor device 403, and the third semiconductor device 405 by increasing a given surface area to be exposed to a cooling agent surrounding it such as air. The heat transfer mechanisms occur through the convection of the surrounding air, the conduction through the air, and radiation. For example, the heat sink may exhibit a much greater surface area for convection compared with the surface area of the first semiconductor device 401, the second semiconductor device 403, and the third semiconductor device 405 by employing a large number of fins in the form of a matrix of geometrically shaped pins or an array of straight or flared fins. In another example, such as where convection is low, a matted-black surface color may radiate much more efficiently than shiny, metallic colors in the visible spectrum. Any suitable form for the heat sink may alternatively be utilized.

In accordance with an embodiment, a semiconductor device comprising a first semiconductor device, wherein the first semiconductor device comprises a first voltage regulator is provided. An encapsulant encapsulates the first semiconductor device and a through via is separated from the first semiconductor device and extending from a first side of the encapsulant to a second side of the encapsulant. A first redistribution layer is electrically connected to the through via on a first side of the encapsulant, and a second semiconductor device is electrically connected to the first semiconductor device through the first redistribution layer, wherein the second semiconductor device comprises a first logic device.

In accordance with another embodiment, a semiconductor device comprising an encapsulant with a first side and a second side opposite the first side is provided. A through via extends from the first side to the second side and a first voltage regulator die extends from the first side to the second side. A first redistribution layer is electrically connected to the through via and the first voltage regulator die, and a first logic die electrically connected to the first voltage regulator die through the first redistribution layer.

In accordance with yet another embodiment, a method of manufacturing a semiconductor device comprising encapsulating a via and a first voltage regulator die with a first encapsulant, wherein the first encapsulant is in physical contact with the via is provided. A first redistribution layer is formed on a first side of the first encapsulant, the first redistribution layer in electrical connection with the via, and a first logic die is bonded to the first redistribution layer, the first logic die in electrical connection with the first voltage regulator die.

In accordance with yet another embodiment, a method of manufacturing a semiconductor device comprising forming a first redistribution layer over a first semiconductor die, wherein the first semiconductor die is a logic die, is provided. Vias are formed on an opposite side of the first redistribution layer than the first semiconductor die, and a first integrated voltage regulator is placed adjacent to the vias. The first integrated voltage regulator and the vias are encapsulated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first semiconductor device, wherein the first semiconductor device comprises a first voltage regulator;
   an encapsulant encapsulating the first semiconductor device;
   a through via separated from the first semiconductor device and extending from a first side of the encapsulant to a second side of the encapsulant;
   a first redistribution layer electrically connected to the through via on a first side of the encapsulant;
   a second semiconductor device electrically connected to the first semiconductor device through the first redistribution layer, wherein the second semiconductor device comprises a first logic device; and
   a third semiconductor device, wherein the encapsulant encapsulates the third semiconductor device and wherein the third semiconductor device comprises a second voltage regulator.

2. The semiconductor device of claim 1, further comprising a fourth semiconductor device electrically connected to the first redistribution layer and located on an opposite side of the first redistribution layer than the third semiconductor device, the fourth semiconductor device comprising a second logic device.

3. The semiconductor device of claim 2, further comprising:
   a fifth semiconductor device electrically connected to the first redistribution layer and located on an opposite side of the first redistribution layer than the third semiconductor device, the fifth semiconductor device comprising an I/O device; and
   a second encapsulant encapsulating the second semiconductor device, the fourth semiconductor device, and the fifth semiconductor device.

4. The semiconductor device of claim 1, wherein the first semiconductor device comprises a through silicon via.

5. The semiconductor device of claim 1, wherein sidewalls of the first semiconductor device are free from an encapsulant.

6. The semiconductor device of claim 1, further comprising an underfill material in physical contact with the first semiconductor device.

7. The semiconductor device of claim 1, further comprising a second redistribution layer on an opposite side of the first semiconductor device than the first redistribution layer.

8. The semiconductor device of claim 7, further comprising external connectors in contact with the second redistribution layer.

9. The semiconductor device of claim 7, wherein the first semiconductor device comprises a through silicon via extending between the first redistribution layer and the second redistribution layer.

10. The semiconductor device of claim 9, wherein the second semiconductor device comprises a passivation layer that is planar with the encapsulant.

11. The semiconductor device of claim 1, further comprising a second encapsulant encapsulating the second semiconductor device.

12. A semiconductor device comprising:
    an encapsulant with a first side and a second side opposite the first side;
    a through via extending from the first side to the second side;
    a first voltage regulator die extending from the first side to the second side;
    a first redistribution layer electrically connected to the through via and the first voltage regulator die;
    a first logic die electrically connected to the first voltage regulator die through the first redistribution layer; and
    a heat spreader thermally connected to the first logic die.

13. The semiconductor device of claim 12, further comprising a second voltage regulator extending from the first side to the second side.

14. The semiconductor device of claim 13, further comprising a second logic die electrically connected to the first redistribution layer.

15. The semiconductor device of claim 14, further comprising an I/O die electrically connected to the through via.

16. The semiconductor device of claim 12, further comprising a second redistribution layer located on an opposite side of the first voltage regulator die than the first logic die.

17. The semiconductor device of claim 16, further comprising a through silicon via extending through the first voltage regulator die and electrically connected to the second redistribution layer.

18. A method of manufacturing a semiconductor device, the method comprising:
    encapsulating a via and a first voltage regulator die with a first encapsulant, wherein the first encapsulant is in a physical contact with the via;
    forming a first redistribution layer on a first side of the first encapsulant, the first redistrbution layer in electrical connection with the via;
    bonding a first logic die to the first redistribution layer, the first logic die in electrical connection with the first voltage regulator die;
    bonding a second logic die to the first redistribution layer; and
    encapsulating the first logic die and the second logic die with a second encapsulant, wherein the encapsulant the via and the first voltage regulator die further comprises encapsulating a second voltage regulator with the first encapsulant.

19. The method of claim 18, further comprising forming a second redistribution layer on an opposite side of the first encapsulant from the first redistribution layer.

20. The method of claim 19, wherein the forming the second redistribution layer electrically connects the second redistribution layer with through vias that extend through the first voltage regulator die.

21. The method of claim 18, further comprising direct bonding an external connection with the via on an opposite side of the first encapsulant from the first redistribution layer.

22. A method of manufacturing a semiconductor device, the method comprising
    forming a first redistribution layer over a first semiconductor die, wherein the first semiconductor die is a logic die;
    forming vias on an opposite side of the first redistribution layer than the first semiconductor die;
    placing a first integrated voltage regulator adjacent to the vias, wherein the first integrated voltage regulator comprises through silicon vias; and
    encapsulating the first integrated voltage regulator and the vias.

23. The method of claim 22, further comprising encapsulating the first semiconductor die and a second semiconductor die prior to the forming the first redistribution layer.

24. The method of claim 22, further comprising forming a second redistribution layer on an opposite side of the first integrated voltage regulator than the first redistribution layer.

25. The method of claim 22, wherein the first integrated voltage regulator comprises through silicon vias.

* * * * *

UNITED STATES PATENT AND TRADEMARK OFFICE
CERTIFICATE OF CORRECTION

PATENT NO. : 9,893,042 B2  
APPLICATION NO. : 15/147617  
DATED : February 13, 2018  
INVENTOR(S) : Chen-Hua Yu Page 1 of 1

It is certified that error appears in the above-identified patent and that said Letters Patent is hereby corrected as shown below:

In Column 24, Line 29-30, Claim 18, delete "wherein the first encapsulant is in a physical contact with the via;" and insert --wherein the first encapsulant is in physical contact with the via;--.

In Column 24, Line 32, Claim 18, delete "redistrbution" and insert --redistribution--.

In Column 24, Line 40-41, Claim 18, delete "wherein the encapsulant the via" and insert --wherein the encapsulating the via--.

Signed and Sealed this  
Fifth Day of June, 2018

Andrei Iancu  
*Director of the United States Patent and Trademark Office*